(12) United States Patent
Maejima

(10) Patent No.: US 11,169,742 B2
(45) Date of Patent: Nov. 9, 2021

(54) MEMORY SYSTEM, MEMORY CONTROLLER, AND SEMICONDUCTOR MEMORY DEVICE

(71) Applicant: KIOXIA CORPORATION, Tokyo (JP)

(72) Inventor: Hiroshi Maejima, Tokyo (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 16/804,037

(22) Filed: Feb. 28, 2020

(65) Prior Publication Data

US 2020/0401347 A1    Dec. 24, 2020

(30) Foreign Application Priority Data

Jun. 19, 2019 (JP) .............................. JP2019-113565

(51) Int. Cl.
| | | |
|---|---|---|
| *G06F 3/00* | (2006.01) | |
| *G06F 3/06* | (2006.01) | |
| *G11C 16/08* | (2006.01) | |
| *G06N 3/08* | (2006.01) | |
| *G11C 16/04* | (2006.01) | |

(52) U.S. Cl.
CPC .......... *G06F 3/0659* (2013.01); *G06F 3/0604* (2013.01); *G06F 3/0679* (2013.01);
(Continued)

(58) Field of Classification Search
CPC .............. G11C 11/1675; G11C 11/405; G11C 11/4076; G11C 11/5607; G11C 15/02; G11C 15/046; G11C 2211/4016; G11C 8/04; G11C 8/12; G11C 16/0483; G11C 16/08; H01L 27/0207; H01L 27/1203; G06F 7/5443; G06F 12/0246;
(Continued)

(56) References Cited

U.S. PATENT DOCUMENTS

| 9,430,735 B1 | 8/2016 | Vali et al. |
| 2009/0237992 A1 | 9/2009 | Maejima |

(Continued)

FOREIGN PATENT DOCUMENTS

| JP | 2009230777 A | 10/2009 |
| TW | 201626231 A | 7/2016 |

OTHER PUBLICATIONS

Biswas, et al., "Conv-RAM: An Energy-Efficient SRAM with Embedded Convolution Computation for Low-Power CNN-Based Machine Learning Applications", ISSCC 2018 / Session 31 / Computation in Memory for Machine Learning / 31.1, 2018, 488-489.

(Continued)

*Primary Examiner* — Thong Q Le
(74) *Attorney, Agent, or Firm* — Holtz, Holtz & Volek PC

(57) ABSTRACT

According to one embodiment, a memory system includes a memory controller configured to send a first command set including arithmetic operation target data and an address that designates a memory cell to store weight data; and a nonvolatile semiconductor memory configured to receive the first command set from the memory controller, read the weight data from the memory cell designated by the address, perform an arithmetic operation based on the arithmetic operation target data and the weight data, and send arithmetic operation result data to the memory controller.

13 Claims, 22 Drawing Sheets

(52) U.S. Cl.
CPC ............ *G06N 3/08* (2013.01); *G11C 16/0483* (2013.01); *G11C 16/08* (2013.01)

(58) Field of Classification Search
CPC .............. G06F 12/0811; G06F 12/0875; G06F 15/7825; G06F 17/153; G06F 17/16; G06F 2207/4824; G06F 2212/1016; G06F 2212/454; G06F 3/0604; G06F 3/0659; G06F 3/0679; G06F 7/4981
USPC ............ 365/189.011, 230.03, 189.15, 210.1, 365/189.16, 72; 711/154
See application file for complete search history.

(56) References Cited

U.S. PATENT DOCUMENTS

| | | |
|---|---|---|
| 2009/0267128 A1 | 10/2009 | Maejima |
| 2009/0268522 A1 | 10/2009 | Maejima |
| 2010/0207195 A1 | 8/2010 | Fukuzumi et al. |
| 2011/0284946 A1 | 11/2011 | Kiyotoshi |
| 2016/0085443 A1 | 3/2016 | Tomishima et al. |
| 2020/0160158 A1* | 5/2020 | Okamoto ............ G06N 3/0635 |

OTHER PUBLICATIONS

Lue, et al., "A Novel 3D AND-type NVM Architecture Capable of High-density, Low-power In-Memory Sum-of-Product Computation for Artificial Intelligence Application", IEEE Symposium on VLSI Technology, 2018, 177-178.

U.S. Appl. No. 16/795,763; First Named Inventor: Naohito Morozumi; Title: "Semiconductor Memory Device"; filed Feb. 20, 2020.

\* cited by examiner

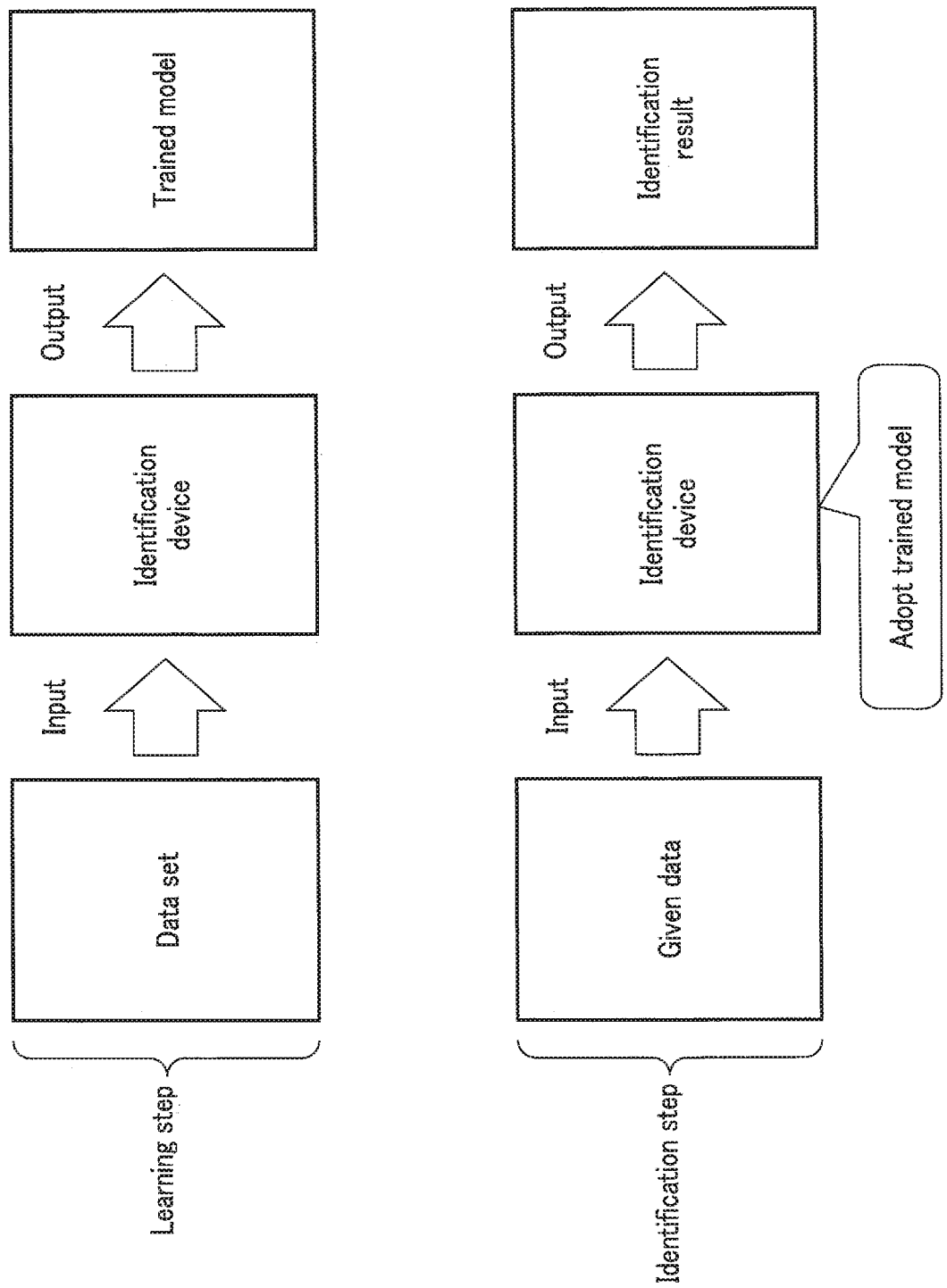
F I G. 1

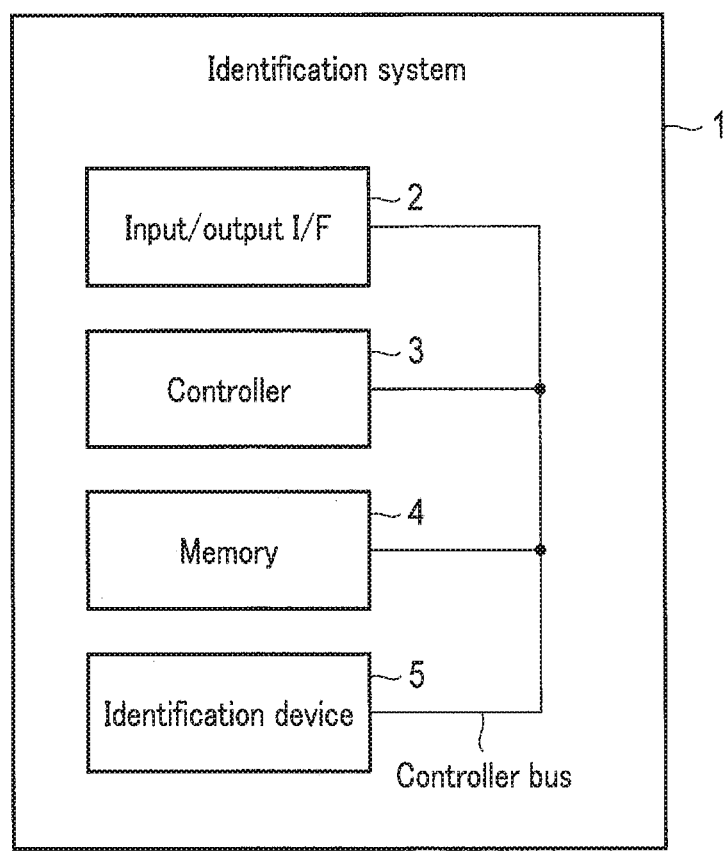
F I G. 2

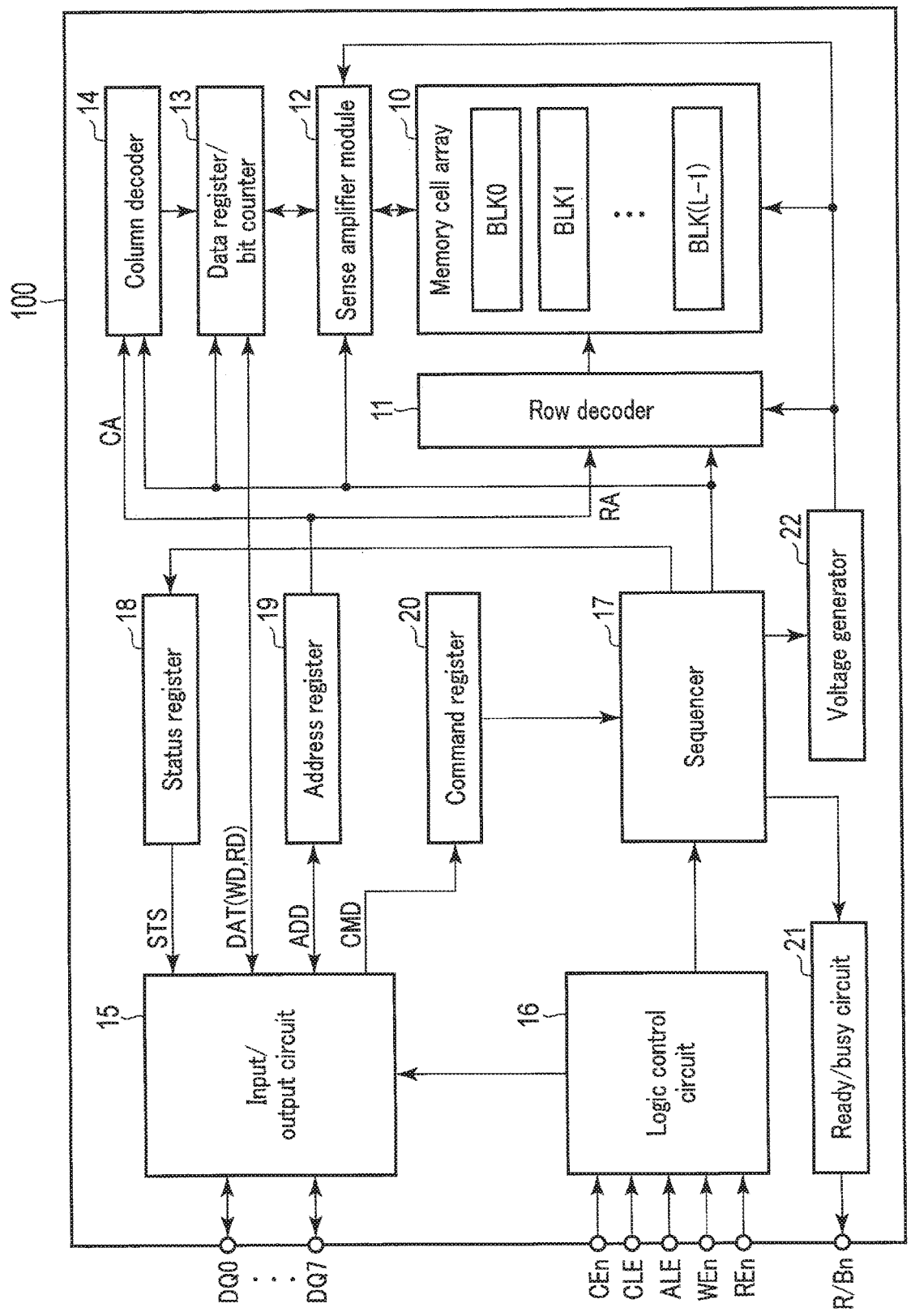
F I G. 5

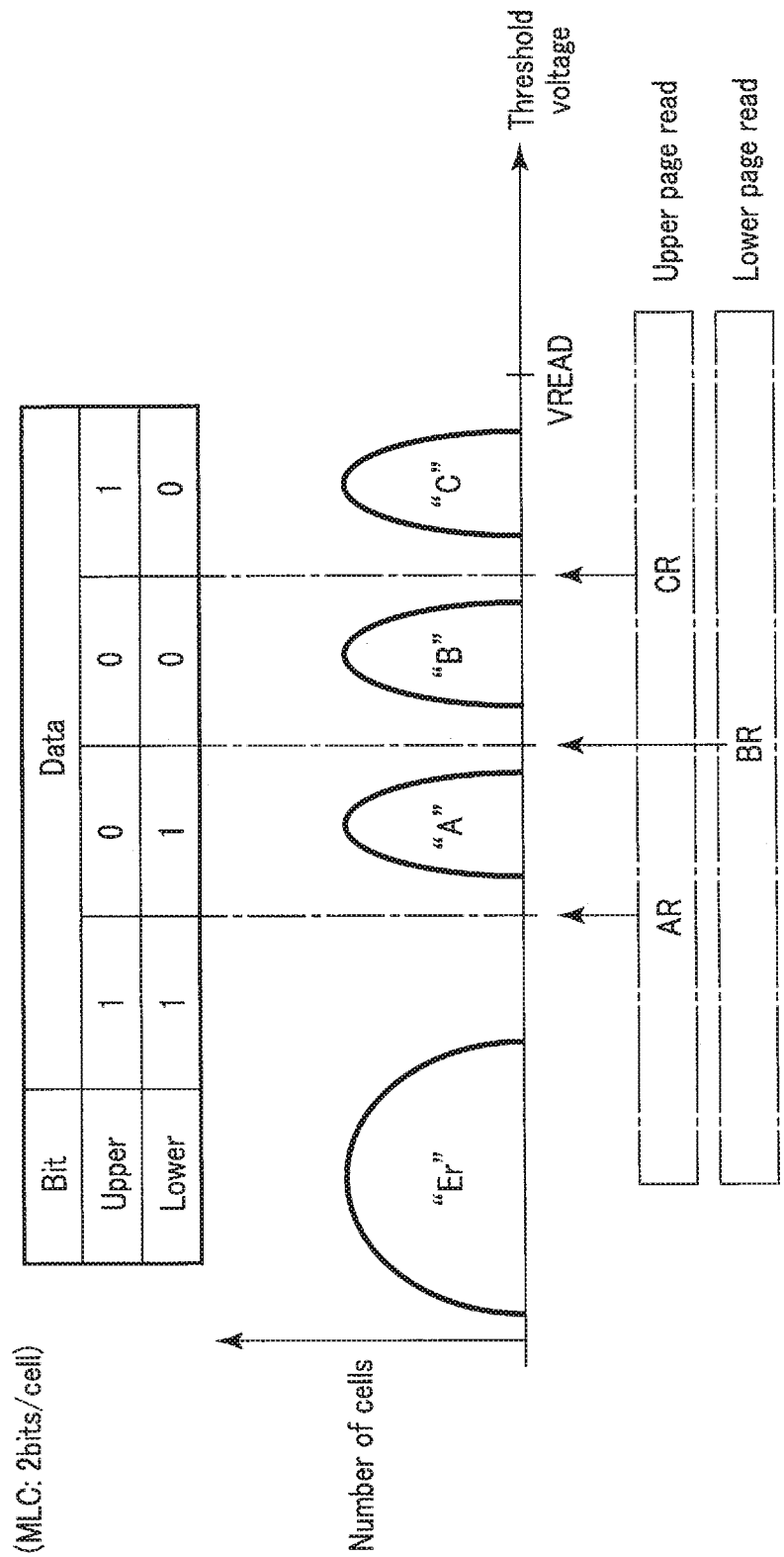
F I G. 7

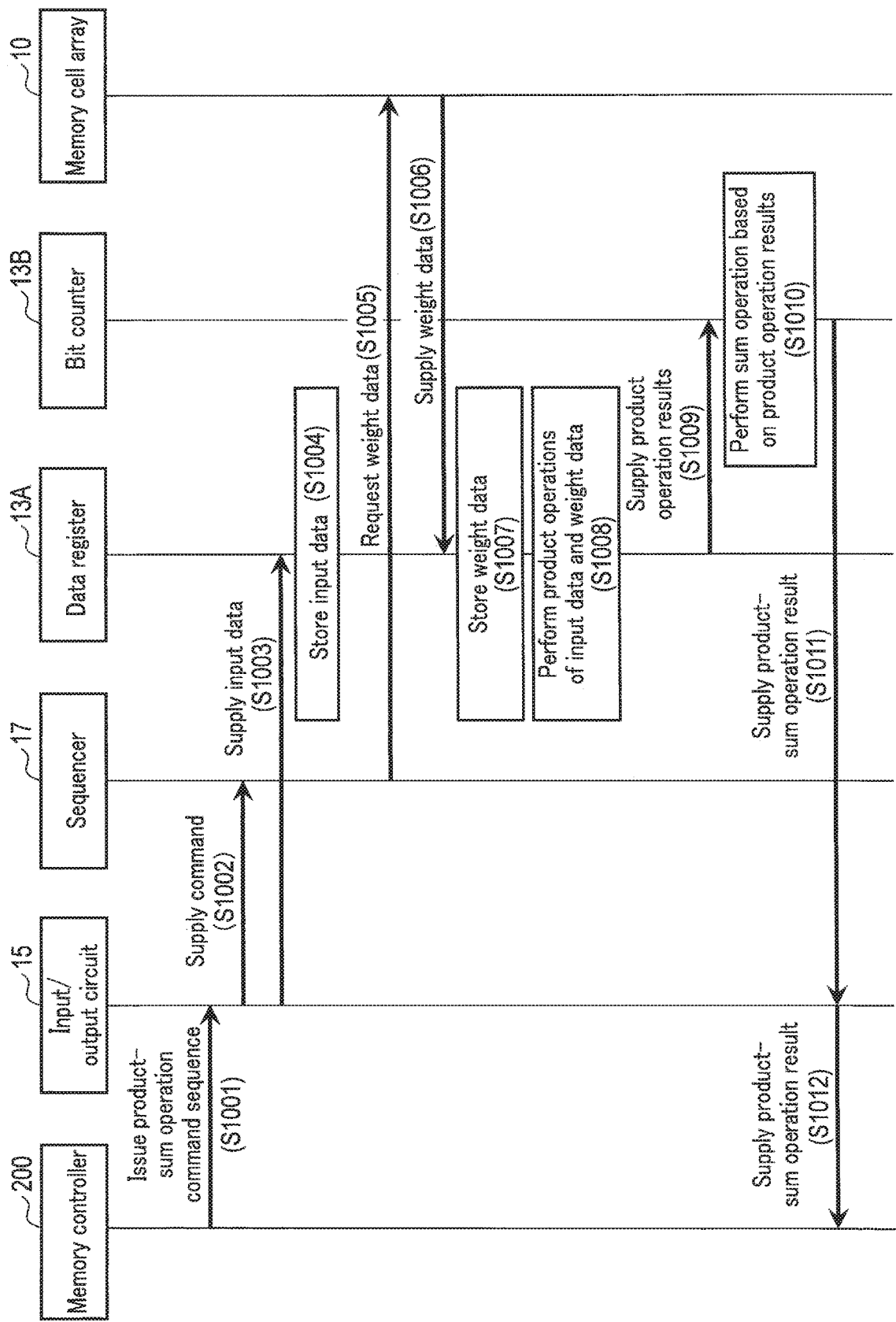
F I G. 10

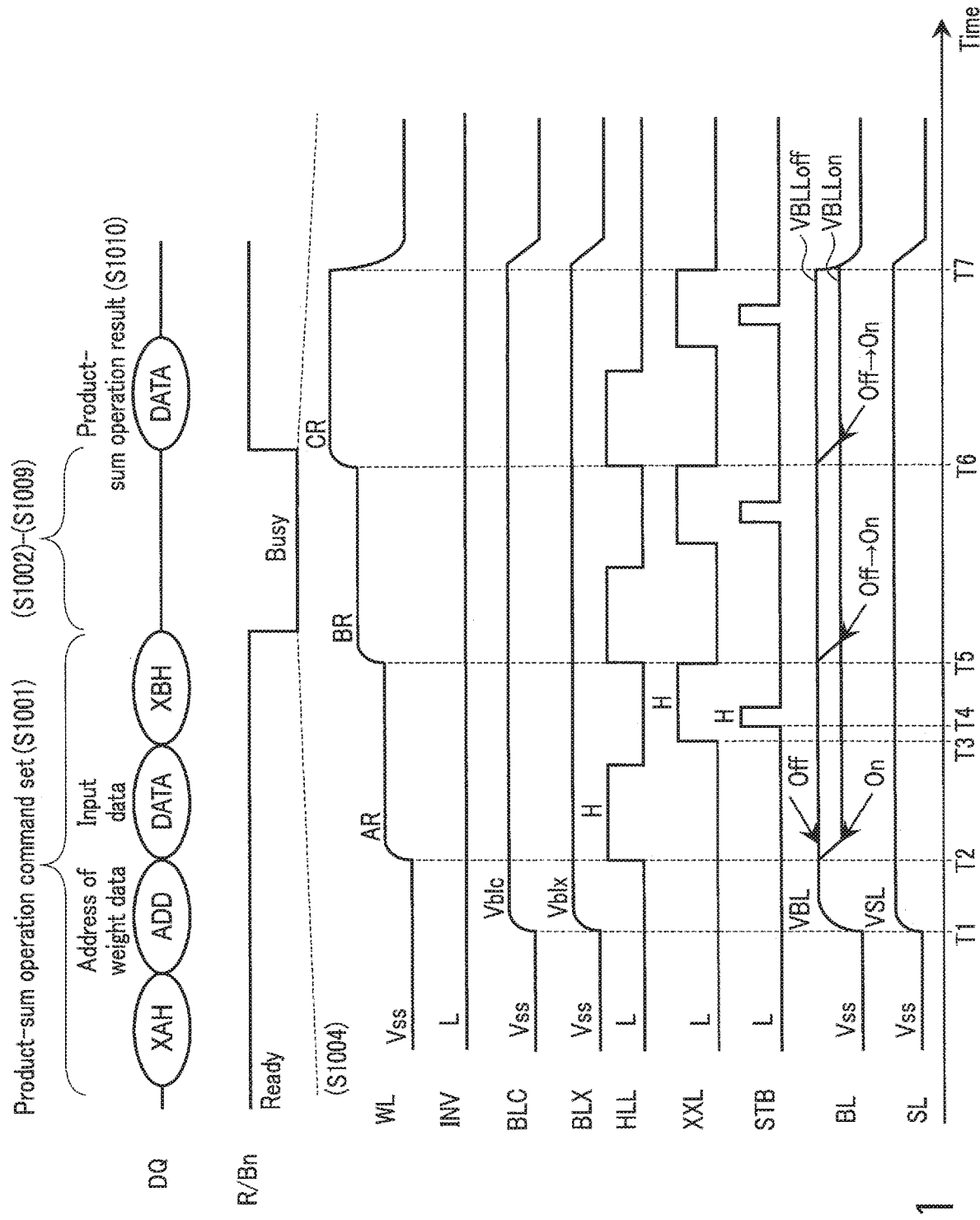
F I G. 11

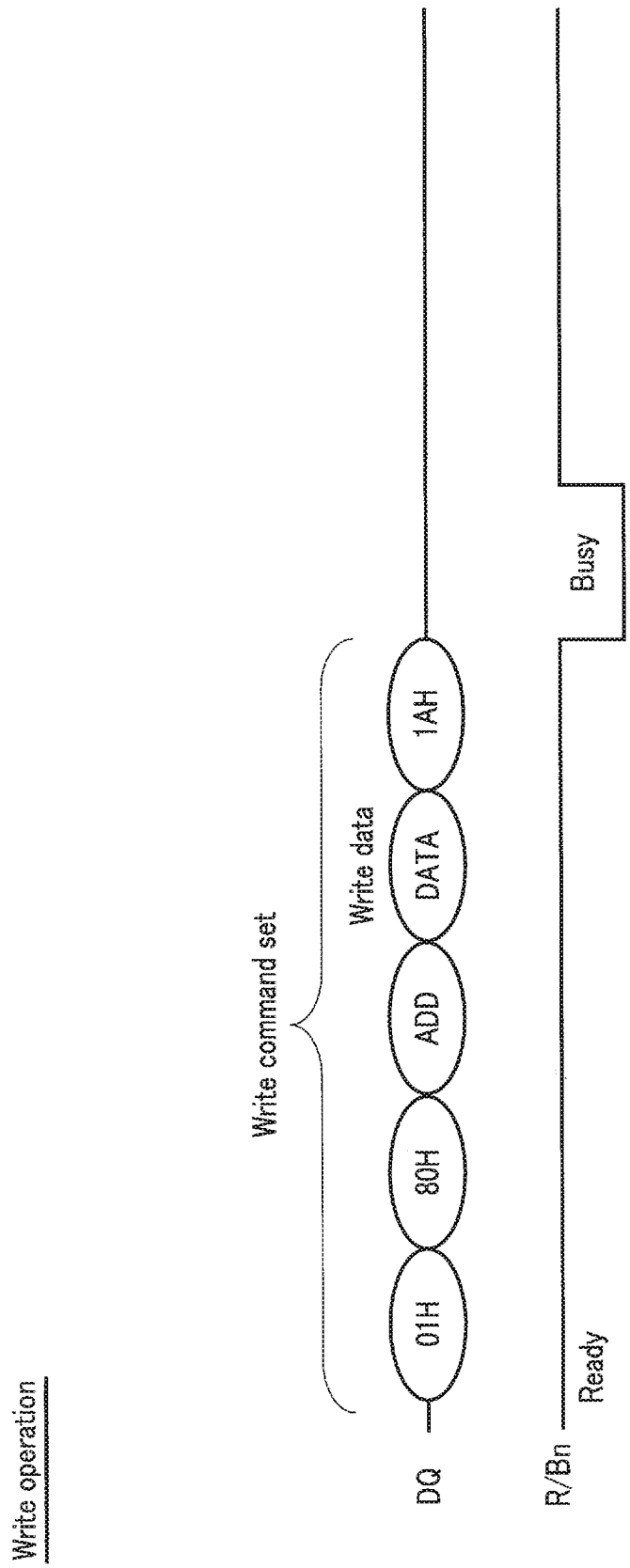
F I G. 13

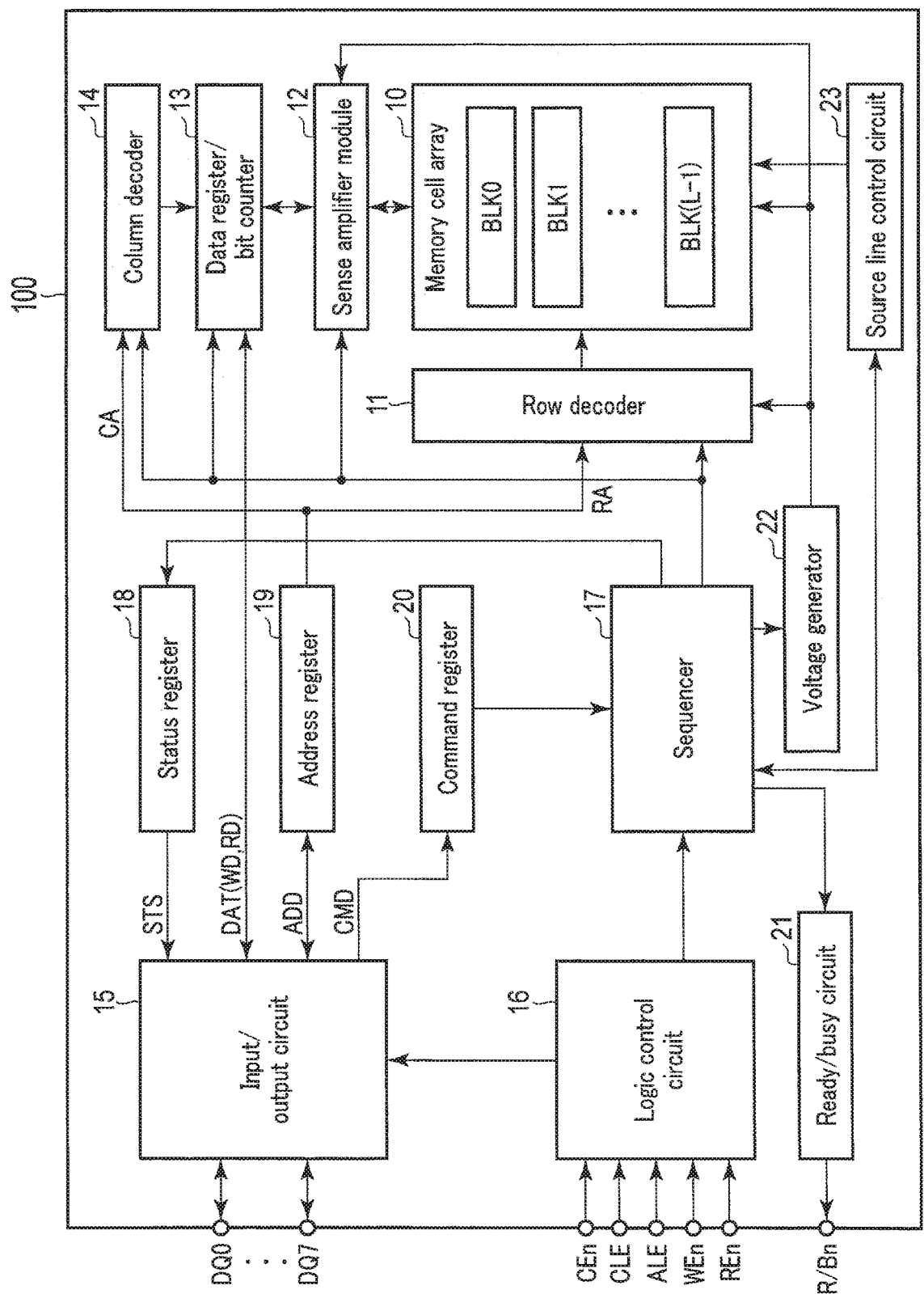
F I G. 16

MEMORY SYSTEM, MEMORY CONTROLLER, AND SEMICONDUCTOR MEMORY DEVICE

CROSS-REFERENCE TO RELATED APPLICATIONS

This application is based upon and claims the benefit of priority from prior Japanese Patent Application No. 2019-113565, filed Jun. 19, 2019, the entire contents of which are incorporated herein by reference.

FIELD

Embodiments described herein relate generally to a memory system, memory controller, and semiconductor memory device used for a neural network.

BACKGROUND

Development of artificial intelligence (AI) is progressing. As an AI technology, a neural network has been considered. The neural network is a model devised by referring to brain neurons and synapses, and includes at least two steps of learning and identification. In the learning step, features are learned from multiple inputs, and a neural network for identification processing is constructed. In the identification step, what the new input is identified by using the constructed neural network.

BRIEF DESCRIPTION OF THE DRAWINGS

FIG. 1 is a conceptual diagram showing a learning step and an identification step in an identification system.

FIG. 2 is a block diagram of an identification system according to a first embodiment.

FIG. 5 is a block diagram of the semiconductor memory device according to the first embodiment.

FIG. 7 is a diagram showing threshold distribution of memory cells according to the first embodiment.

FIG. 10 is a flowchart showing an operation of the memory system according to the first embodiment.

FIG. 11 is a diagram showing a command set and waveform chart in an operation of the memory system in the identification step.

FIG. 13 shows a command sequence relating to a write operation.

FIG. 16 is a block diagram of a semiconductor memory device according to a second embodiment.

DETAILED DESCRIPTION

Figure 3:
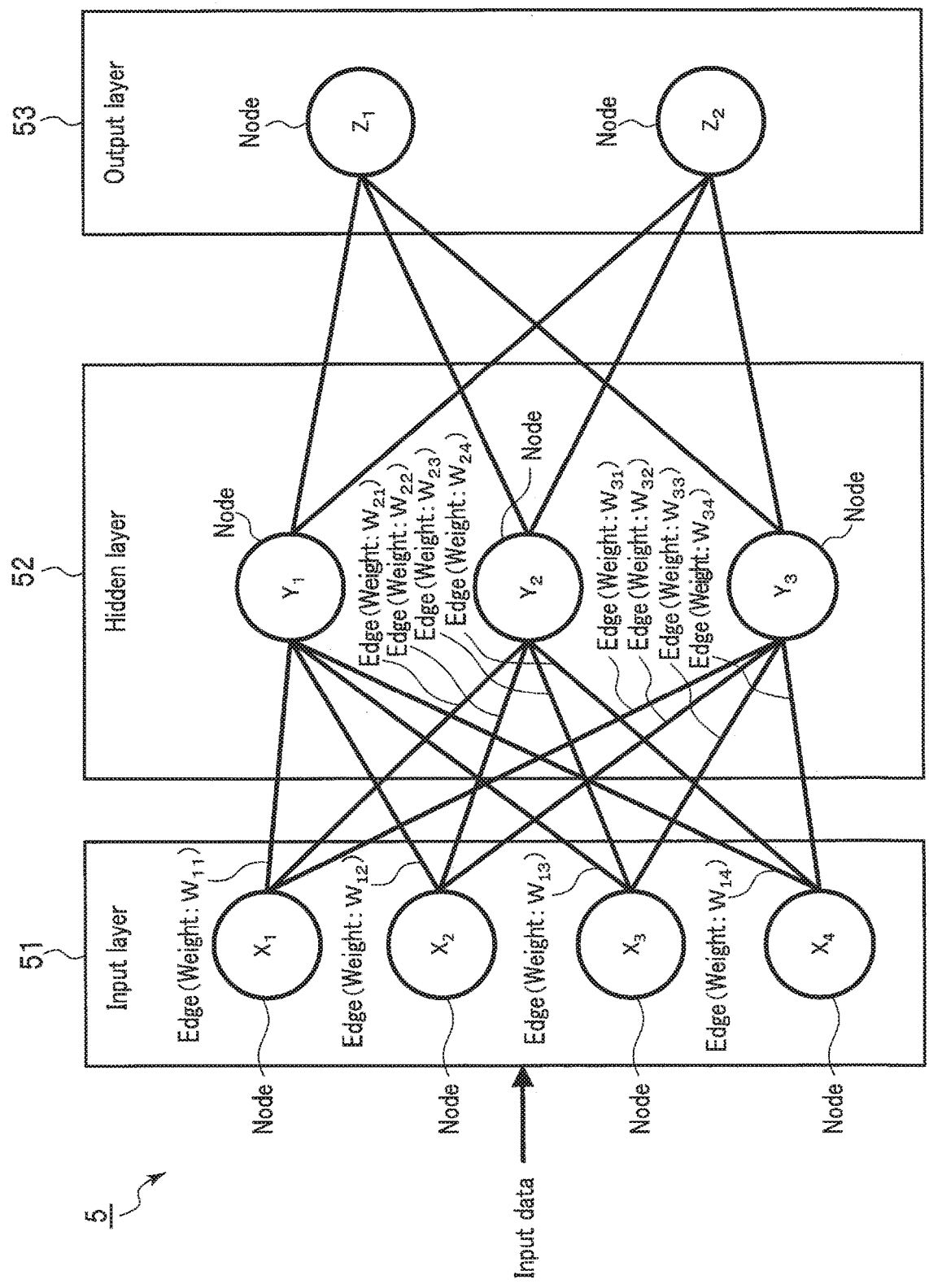
FIG. 3 is a diagram showing a concept of an identification device according to the first embodiment.

In generally, according to one embodiment, a memory system includes a memory controller configured to send a first command set including arithmetic operation target data and an address that designates a memory cell to store weight data; and a nonvolatile semiconductor memory configured to receive the first command set from the memory controller, read the weight data from the memory cell designated by the address, perform an arithmetic operation based on the arithmetic operation target data and the weight data, and send arithmetic operation result data to the memory controller.

Hereinafter, embodiments will be described with reference to the drawings. Some embodiments to be described below are mere exemplification of a device and method for embodying a technical idea, and the shape, configuration, arrangement, etc. of the components do not specify the technical idea. Each function block is implemented in the form of hardware, software, or a combination thereof. The function blocks are not necessarily separated as in the following examples. For example, some functions may be executed by a function block different from the function block to be described as an example. In addition, the function block to be described as an example may be divided into smaller function subblocks. In the following description, elements having the same function and configuration will be assigned the same reference symbol, and a repetitive description will be given only where necessary.

<1> First Embodiment

<1-1> Configuration

<1-1-1> Overview of Identification System

In the present embodiment, an identification system (device) using a neural network will be described. The identification system learns a parameter for identifying the contents of identification target data (input data) in a learning step, and identifies the identification target data based on the learning result in an identification step. The identification target data is data to be identified, and is image data, audio data, text data, or the like. Described below as an example is the case where the identification target data is image data and a neural network that identify image data is used.

As shown in FIG. 1, in the identification system according to the present embodiment, multiple data items (a data set) for training are input to an identification device, which is part of the identification device, in the learning step. The identification device constructs a neural network (trained model) based on the data set.

Specifically, the identification device constructs a neural network for classifying identification target data. The identification device uses input data and an evaluation of the label when constructing a neural network. The evaluation of the label includes a "positive evaluation" indicating that the contents of data match the label, and a "negative evaluation" indicating that the contents of data do not match the label. The positive evaluation or negative evaluation is associated with a score (truth score, or identification score), such as "0" data or "1" data, and the score is also referred to as Ground Truth. The "score" is a numerical value, and is the signal itself, which is exchanged in the neural network. The identification device performs an arithmetic operation on an input data set, and adjusts a parameter used in the arithmetic operation to bring the identification score, which is the operation result (also referred to as an inference), closer to the truth score prepared in advance. The "identification score" indicates a degree of matching between the input data set and the label associated with the input data set. The "truth score" indicates an evaluation of the label associated with the input data set.

Once a neural network is constructed, the identification system identifies what the given data (the input data set) is by using the neural network in the identification step (output of an identification result).

<1-1-2> Configuration of Identification System

Next, the identification system according to the present embodiment will be described with reference to FIG. 2. FIG. 2 is a block diagram showing a hardware configuration of the identification system.

As shown in FIG. 2, the identification system 1 includes an input/output interface (I/F) 2, a controller (central processing unit (CPU)) 3, a memory 4, and an identification device 5. The input/output interface 2, the controller 3, the memory 4, and the identification device 5 are each connected to a controller bus.

The input/output interface 2 is, for example, an input/output control circuit (device) which receives a data set, and outputs an identification result. The input/output interface 2 may be a UFS interface based on the universal flash storage (UFS) standard, an SAS interface based on the serial attached SCSI (SAS) standard, or an interface based on another standard, or may be a communication cable itself.

The controller 3 controls the entire identification system 1.

The memory 4 includes, for example, a random access memory (RAM) and a read only memory (ROM).

In the learning step, the identification device 5 learns features from, for example, a data set, and constructs a neural network. The constructed neural network is expressed as a weight coefficient (may be merely referred to as a weight) used in each arithmetic operation unit in the identification device 5. Namely, the identification device 5 constructs a neural network that, when input data corresponding to, for example, an image including an image "X" is input, makes an output indicating that the input data is image "X". The identification device 5 improves the accuracy of the neural network by receiving many input data items.

In the identification step, the identification device 5 obtains a weight coefficient in the neural network. When the neural network is updated, the identification device 5 obtains a new weight coefficient of the neural network to improve the identification accuracy. The identification device 5 which has obtained the weight coefficient receives input data to be identified. Then, the identification device 5 inputs input data in the neural network using the weight coefficient, and identifies the input data.

Each function of the identification system 1 is realized by causing the controller 3 to read predetermined software into hardware such as the memory 4, and reading data from and writing data in the memory 4 under control of the controller 3.

<1-1-3> Identification Device

<1-1-3-1> Concept of Identification Device

The neural network is modeled on the human brain, and consists of a collection of models modeled on nerve cells called neurons.

The neural network includes an input layer, an intermediate layer, and an output layer.

Information output from a neuron in the input layer is input to a neuron in the intermediate layer, and information output from a neuron in the intermediate layer is input to a neuron in the output layer.

The input to each neuron is a value obtained by multiplying input data by a weight and adding a bias to the resultant value. The final output value is determined by subjecting the total value to a specific function. The function to determine the output value is an activation function. The activation function includes, for example, the sigmoid function, softmax function, identity function, and rectified linear unit (ReLU).

Next, a concept of the identification device 5 of the identification system according to the present embodiment will be described with reference to FIG. 3. FIG. 3 is a block diagram showing a concept of the identification device 5 of the identification system according to the present embodiment. Here, a concept of the identification device 5 in the learning step will be described.

As shown in FIG. 3, the identification device 5 includes the input layer 51, the hidden layer 52, and the output layer 53.

In the input layer 51, input nodes are arranged in parallel. The input nodes each obtain input data X and output (distribute) it to a node (nodes) included in the hidden layer 52. The node of the present embodiment is a model modeled on a brain neuron. The node may be referred to as a neuron.

FIG. 3 shows the case where the input layer 51 includes four parallel nodes for simplification. In FIG. 3, data items $X_1$ to $X_4$ are stored in the four nodes, respectively.

In the hidden layer 52, processing nodes are arranged in parallel. The processing nodes each perform an arithmetic operation (product-sum operation) on processing data using a weight coefficient, and output an operation result (operation data) Y to a node or nodes of the subsequent layer.

FIG. 3 shows the case where the hidden layer 52 includes three parallel nodes for simplification. The results of the product-sum operations are stored in the nodes of the hidden layer as data items $Y_1$ to $Y_4$. These data items $Y_1$ to $Y_4$ are input data for the next product-sum operations. A plurality of edges from the input layer 51 to the hidden layer 52 are associated with weights $W_{11}$ to $W_{34}$.

Hereinafter, the relationship between data X, data Y, and weight W will be specifically described. The node in which data item $Y_1$ is stored stores the sum ($\Sigma W_{1i} \times W_i$) of a product of weight $W_{11}$ and data item $X_1$, a product of weight $W_{12}$ and data item $X_2$, a product of weight $W_{13}$ and data item $X_3$, and a product of weight $W_{14}$ and data item $X_4$. Similarly, the node in which data item $Y_2$ is stored stores the sum ($\Sigma W_{2i} \times W_i$) of a product of weight $W_{21}$ and data item $X_1$, a product of weight $W_{22}$ and data item $X_2$, a product of weight $W_{23}$ and data item $X_3$, and a product of weight $W_{24}$ and data item $X_4$. Also, the node in which data item $Y_3$ is stored stores the sum ($\Sigma W_{3i} \times W_i$) of a product of weight $W_{31}$ and data item $X_1$, a product of weight $W_{32}$ and data item $X_2$, a product of weight $W_{33}$ and data item $X_3$, and a product of weight $W_{34}$ and data item $X_4$. Accordingly, the relationship is expressed by $Y_k = \Sigma W_{ki} \times X_i$.

In the output layer 53, output nodes, the number of which is the same as the number of labels, are arranged in parallel. The labels are each associated with identification target data. The output layer 53 performs an arithmetic operation using an activation function for each output node based on the data received from the hidden layer 52, and outputs an identification score. Namely, the identification device 5 outputs an identification score for each label. For example, when the identification device 5 identifies three images of "car", "tree", and "human", the output layer 53 has three output nodes arranged in correspondence with the three labels, "car", "tree", and "human". The output nodes output an identification score corresponding to the label of "car", an identification score corresponding to the label of "tree", and an identification score corresponding to the label of "human". FIG. 3 shows the case where the output layer 53 includes two parallel nodes for simplification. As a result of the arithmetic operation using the activation function, data items $Z_1$ and $Z_2$ are obtained from the nodes of the output layer 53.

The above-described number of nodes included in each of the input layer 51, hidden layer 52 and output layer 53 may be changed as appropriate. In particular, the hidden layer 52 includes only a single-stage processing node group in the figure, but may include a two or more-stage processing nodes. Providing the hidden layer 52 with a multi-stage processing node group will be referred to as "deep learning".

<1-1-3-2> Specific Configuration of Identification Device
<1-1-3-2-1> Memory System Here, as a specific hardware configuration for realizing the identification device 5, a memory system 400 will be described as an example.

Figure 4:
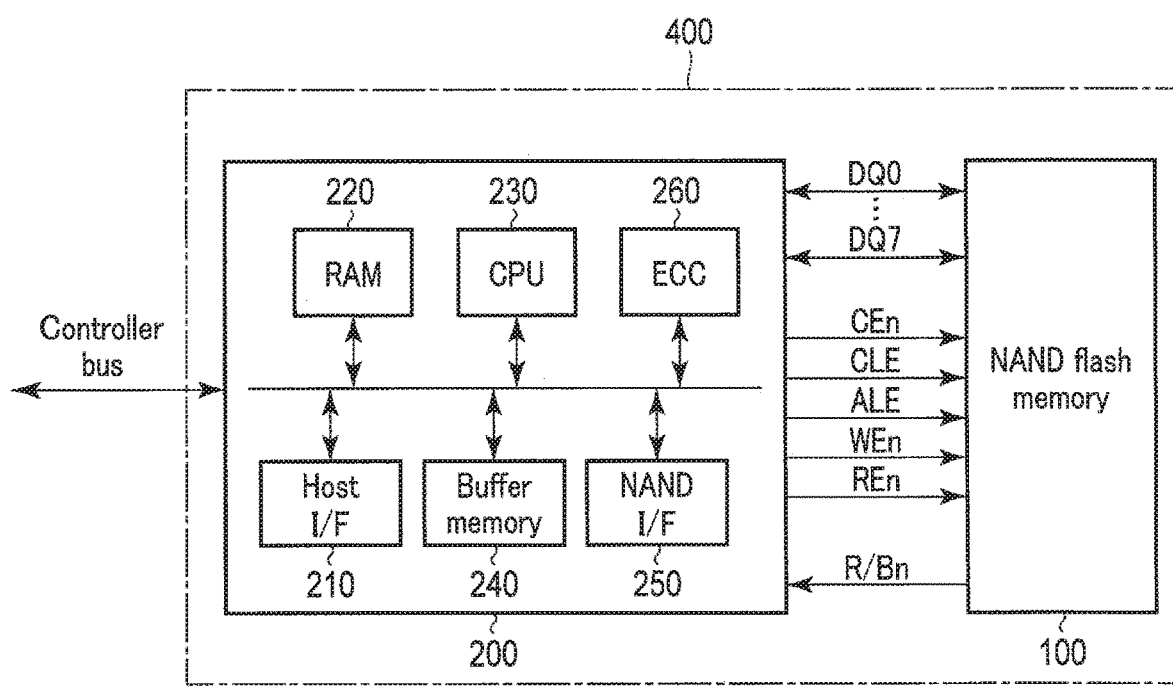
FIG. 4 is a block diagram of a memory system including a semiconductor memory device according to the first embodiment.

As shown in FIG. 4, the memory system 400 includes a NAND flash memory 100 and a memory controller 200. The memory controller 200 and NAND flash memory 100 may form one semiconductor device in combination, for example. The semiconductor device is, for example, a memory card such as an SD™ card, or a solid state drive (SSD).

The NAND flash memory 100 includes a plurality of memory cell transistors, and nonvolatilely stores data. The NAND flash memory 100 is connected to the memory controller 200 via NAND buses, and operates based on a host command (instruction) from the memory controller 200. Specifically, the NAND flash memory 100 transmits and receives, for example, signals DQ0 to DQ7 (eight bits; hereinafter, where DQ0 to DQ7 are not distinguished from each other, the signals will be merely referred to as signal DQ or signal DQ[7:0]) to and from the memory controller 200. Signals DQ0 to DQ7 include, for example, data, an address, and a command. The NAND flash memory 100 receives from the memory controller 200, for example, a chip enable signal CEn, a command latch enable signal CLE, an address latch enable signal ALE, a write enable signal WEn, and a read enable signal REn. The NAND flash memory 100 transmits a ready/busy signal R/Bn to the memory controller 200.

The chip enable signal CEn is a signal for enabling the NAND flash memory 100, and is asserted, for example, at the low ("L") level. The command latch enable signal CLE is a signal indicating that signal DQ is a command, and is asserted, for example, at the high ("H") level. The address latch enable signal ALE is a signal indicating that signal DQ is an address, and is asserted, for example, at the "H" level. The write enable signal WEn is a signal for taking a received signal into the NAND flash memory 100, and is asserted, for example, at the "L" level whenever a command, an address, data, or the like is received from the memory controller 200. Accordingly, whenever the write enable signal WEn is toggled, signal DQ is taken into the NAND flash memory 100. The read enable signal REn is a signal for the memory controller 200 to read data from the NAND flash memory 100. The read enable signal REn is asserted, for example, at the "L" level. The ready/busy signal R/Bn is a signal indicating whether the NAND flash memory 100 is in a ready state or in a busy state (in a state where a command is received from the memory controller 200 or in a state where a command isn't received therefrom), and is brought to the "L" level when the NAND flash memory 100 is in the busy state, for example.

The memory controller 200 instructions the NAND flash memory 100 to read, write, or erase data in response to, for example, a host command from the controller 3. The memory controller 200 also manages the memory space of the NAND flash memory 100.

The memory controller 200 includes a host interface circuit (host I/F) 210, a memory (random access memory (RAM)) 220, a processor (central processing unit (CPU)) 230, a buffer memory 240, a NAND interface circuit (NAND I/F) 250, and an error correction circuit (ECC) 260.

The host interface circuit 210 is connected to the outside (such as the controller 3) via a controller bus, and controls communication with the outside. The host interface circuit 210 transfers a host command and data received from the outside to the processor 230 and the buffer memory 240. The host interface circuit 210 also transfers data in the buffer memory 240 to the outside in response to an instruction of the processor 230.

The NAND interface circuit 250 is connected to the NAND flash memory 100 via the NAND buses, and controls communication with the NAND flash memory 100. The NAND interface circuit 250 transfers an instruction received from the processor 230 to the NAND flash memory 100. At the time of writing data, the NAND interface circuit 250 transfers write data in the buffer memory 240 to the NAND flash memory 100. At the time of reading data, the NAND interface circuit 250 transfers data read from the NAND flash memory 100 to the buffer memory 240.

The processor 230 controls the operation of the entire memory controller 200. The processor 230 also issues various commands in response to external host commands, and transmits them to the NAND flash memory 100. For example, when externally receiving a write-related host command, the processor 230 transmits, in response thereto, a write-related NAND command to the NAND flash memory 100. Similar processing is performed at the time of reading or erasing data. The processor 230 also executes various types of processing, such as wear leveling, for managing the NAND flash memory 100. The processor 230 also executes various arithmetic operations. For example, the processor 230 executes data encryption processing, randomization processing, and the like.

The error correction circuit 260 executes error correction processing on data.

The memory 220 is a semiconductor memory such as a dynamic random access memory (DRAM) or a static RAM (SRAM), and is used as a work area of the processor 230. The memory 220 retains firmware for managing the NAND flash memory 100, various management tables, and the like.

Here, as a specific hardware configuration of the identification device 5, the memory system 400 is described; however, the hardware configuration is not limited to the memory system 400. As another example, it is possible to adopt the memory controller 200 as a hardware configuration of the controller 3, and adopt the NAND flash memory 100 as a hardware configuration of the identification device 5.

<1-1-3-2-2> NAND Flash Memory 100

Next, a configuration of the NAND flash memory 100 will be described with reference to FIG. 5. In FIG. 5, some of the couplings between blocks are indicated by arrows; however, the couplings between blocks are not limited to those shown in FIG. 5.

As shown in FIG. 5, the NAND flash memory 100 includes an input/output circuit 15, a logic control circuit 16, a status register 18, an address register 19, a command register 20, a sequencer 17, a ready/busy circuit 21, a voltage generator 22, a memory cell array 10, a row decoder 11, a sense amplifier module 12, a data register/bit counter 13, and a column decoder 14.

The input/output circuit 15 controls input/output of signal DQ to or from the memory controller 200. Specifically, the input/output circuit 15 includes an input circuit and an output circuit. The input circuit transmits data DAT (write data WD) received from the memory controller 200 to the data register/bit counter 13, transmits an address ADD to the address register 19, and transmits a command CMD to the command register 20. The output circuit transmits status information STS received from the status register 18, data DAT (read data RD) received from the data register/bit counter 13, and an address ADD received from the address register 19 to the memory controller 200.

The logic control circuit 16 receives from the memory controller 200, for example, a chip enable signal CEn, a command latch enable signal CLE, an address latch enable signal ALE, a write enable signal WEn, and a read enable signal REn. The logic control circuit 16 controls the input/output circuit 15 and the sequencer 17 in accordance with the received signal.

The status register 18 temporarily retains status information STS on, for example, a data write, read, or erase operation, and notifies the memory controller 200 whether or not the operation has been normally completed.

The address register 19 temporarily retains the address ADD received from the controller 200 via the input/output circuit 15. Then, the address register 19 transfers a row address RA to the row decoder 11, and a column address CA to the column decoder 14.

The command register 20 temporarily retains the command CMD received from the memory controller 200 via the input/output circuit 15, and transfers it to the sequencer 17.

The sequencer 17 controls the operation of the entire NAND flash memory 100. Specifically, in accordance with the command CMD retained by the command register 20, the sequencer 17 controls, for example, the status register 18, the ready/busy circuit 21, the voltage generator 22, the row decoder 11, the sense amplifier module 12, the data register/bit counter 13, the column decoder 14, etc. to execute a write operation, read operation, erase operation, etc. The sequencer 17 includes a register (not shown).

The ready/busy circuit 21 transmits a ready/busy signal R/Bn to the memory controller 200 in accordance with the operation state of the sequencer 17.

The voltage generator 22 generates voltages necessary for a write operation, read operation, and erase operation under control of the sequencer 17, and supplies the generated voltages to, for example, the memory cell array 10, the row decoder 11, the sense amplifier module 12, etc. The row decoder 11 and sense amplifier module 12 apply the voltage supplied by the voltage generator 22 to the memory cell transistors in the memory cell array 10.

The memory cell array 10 includes blocks BLK0 to BLKn (n is an integer not less than 0). The block BLK is a set of a plurality of nonvolatile memory cells, each of which is associated with a bit line and a word line, and corresponds to a data erase unit, for example. The NAND flash memory 100 may cause each memory cell to store two or more-bit data by adopting, for example, the multi-level cell (MLC) method.

The row decoder 11 decodes the row address RA. The row decoder 11 selects one of the blocks BLK and further selects one of the memory cell units based on the decoding result. The row decoder 11 applies a necessary voltage to the block BLK.

In a read operation, the sense amplifier module 12 senses data read from the memory cell array 10. Then, the sense amplifier module 12 transmits read data RD to the data register/bit counter 13. In a write operation, the sense amplifier module 12 transmits write data WD to the memory cell array 10.

The data register/bit counter 13 includes a plurality of latch circuits. The latch circuits each retain write data WD and read data RD. For example, in a write operation, the data register/bit counter 13 temporarily retains write data WD received from the input/output circuit 15, and transmits it to the sense amplifier module 12. For example, in a read operation, the data register/bit counter 13 temporarily retains read data RD received from the sense amplifier module 12, and transmits it to the input/output circuit 15.

In, for example, a write operation, read operation, or erase operation, the column decoder 14 decodes the column address CA, and selects a latch circuit in the data register/bit counter 13 in accordance with the decoding result.

<1-1-3-2-3> Memory Cell Array

Figure 6:
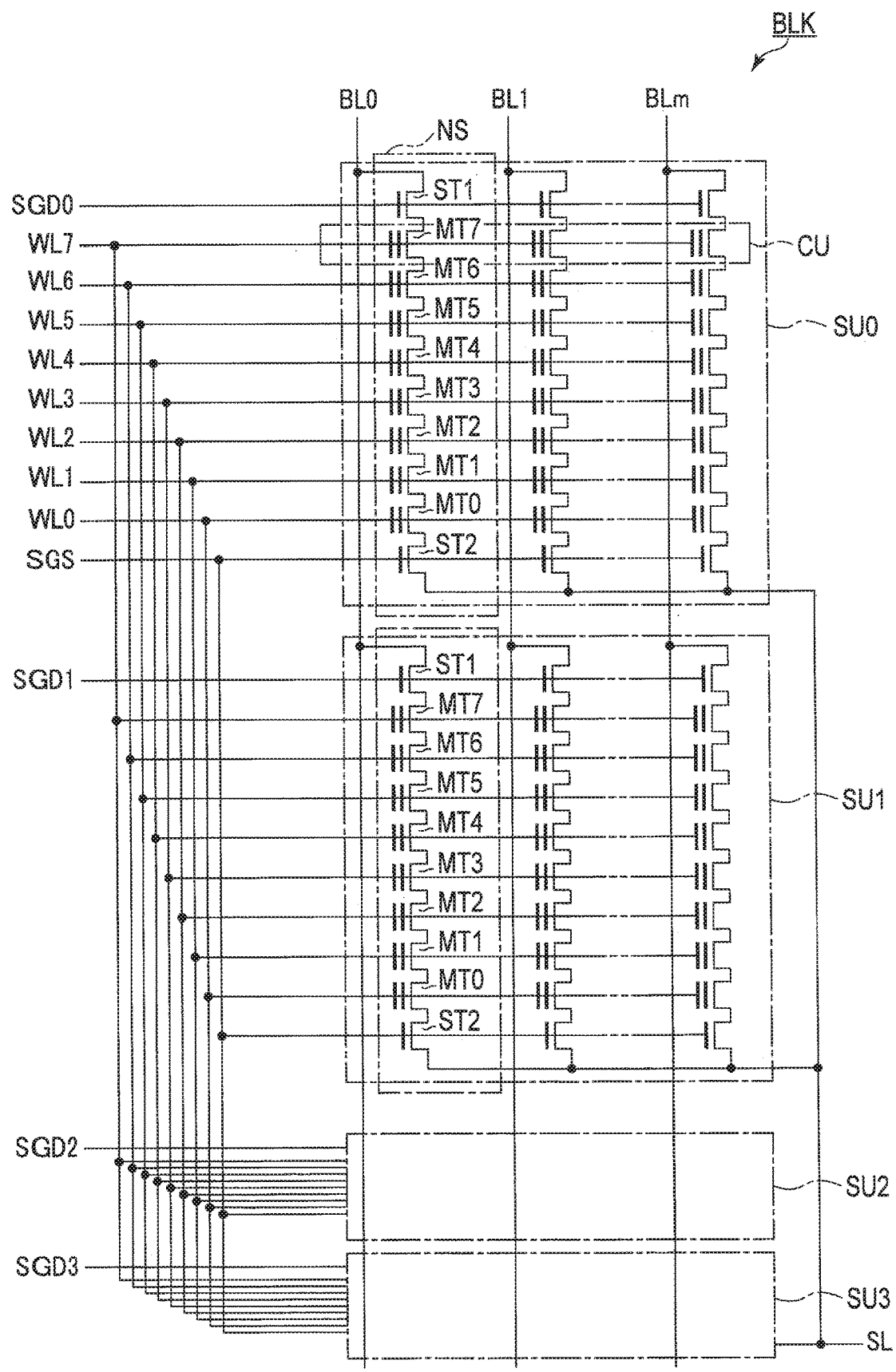
FIG. 6 is a diagram showing a memory cell array according to the first embodiment.

FIG. 6 is a circuit diagram showing a configuration example of the memory cell array 10 included in the NAND flash memory 100 according to the first embodiment, and shows a detailed circuit configuration of one block BLK in the memory cell array 10. As shown in FIG. 6, the block BLK includes, for example, four string units SU0 to SU3.

Each string unit SU includes a plurality of NAND strings NS associated with bit lines BL0 to BLm (m is an integer not less than 0), respectively. Each NAND string NS includes, for example, memory cell transistors MT0 to MT7 and select transistors ST1 and ST2.

The memory cell transistors MT each include a control gate and a charge storage layer, and nonvolatilely stores data. The memory cell transistors MT0 to MT7 included in each NAND string NS are connected in series between the source of select transistor ST1 and the drain of select transistor ST2. The control gates of memory cell transistors MT0 of the NAND strings NS included in the same block BLK are connected in common to word line WL0. Similarly, the control gates of memory cell transistors MT1 to MT7 of the NAND strings NS included in the same block BLK are connected in common to respective word lines WL1 to WL7. Hereinafter, a plurality of memory cell transistors MT connected to a common word line WL in each string unit SU are called a cell unit CU. The set of one-bit data stored in the cell unit is called a "page". Therefore, when two-bit data is stored in one memory cell transistor MT, the cell unit stores data of two pages.

The select transistors ST1 and ST2 are used to select a string unit SU in various operations. The drains of select transistors ST1 included in the NAND strings NS corresponding to the same column address are connected in common to a corresponding bit line BL. The gates of select transistors ST1 included in string unit SU0 are connected in common to select gate line SGD0. Similarly, the gates of select transistors ST1 included in string units SU1 to SU3 are connected in common to respective select gate lines SGD1 to SGD3. The sources of select transistors ST2 in the same block BLK are connected in common to one source line SL, and the gates of select transistors ST2 in the same block BLK are connected in common to one select gate line SGS.

In the above-described circuit configuration of the memory cell array 10, the word lines WL0 to WL7 are provided for each block BLK. The bit lines BL0 to BLm are shared by a plurality of blocks BLK. The source line SL is shared by a plurality of blocks BLK. The above-described number of string units SU included in each block BLK and number of each of the memory cell transistors MT and select transistors ST1 and ST2 included in each NAND string NS are mere examples, and may be any number. The number of each of the word lines WL and the select gate lines SGD and SGS is changed based on the number of each of the memory cell transistors MT and the select transistors ST1 and ST2.

The threshold voltage distribution of the threshold voltages of a plurality of memory cell transistors MT of the memory cell array 10 is, for example, as shown in FIG. 7. FIG. 7 shows a threshold voltage distribution and read voltages of memory cell transistors MT of the case where each memory cell transistor MT stores two-bit data, in which the vertical axis corresponds to the number of memory cell transistors MT, and the horizontal axis corresponds to the threshold voltages Vth of the memory cell transistors MT. As shown in FIG. 7, the memory cell transistors MT form a plurality of threshold voltage distribution lobes depending on the bit numbers of data stored therein. Hereinafter, the multi-level cell (MLC) method, in which one memory cell transistor MT stores two-bit data, will be described as an example of the write method.

As shown in FIG. 7, the memory cell transistors MT form four threshold voltage distribution lobes in the case of the MLC method. The four threshold voltage distribution lobes will be called an "Er" state, "A" state, "B" state, and "C" state in the ascending instruction of the threshold voltage. In the MLC method, for example, "11 (lower, upper)" data, "10" data, "00" data, and "01" data are allocated to the "Er" state, "A" state, "B" state, and "C" state, respectively.

In the above-described threshold voltage distribution, a read voltage is set between adjacent threshold voltage distribution lobes. For example, a read voltage AR is set between the maximum threshold voltage of the "Er" state and the minimum threshold voltage of the "A" state, and is used for an operation to determine whether the threshold voltage of a memory cell transistor MT is included in the "Er"-state threshold voltage distribution lobe or in the "A"-state threshold distribution lobe. When read voltage AR is applied to the memory cell transistor MT, the memory cell transistors in the "Er" state are turned on, and the memory cell transistors in the "A" state, "B" state, and "C" state are turned off. The other read voltages are set in a similar manner. Read voltage BR is set between the "A"-state threshold voltage distribution lobe and the "B"-state threshold voltage distribution lobe, and read voltage CR is set between the "B"-state threshold voltage distribution lobe and the "C"-state threshold voltage distribution lobe. A read pass voltage VREAD is set at a voltage higher than the maximum threshold voltage of the highest threshold voltage distribution lobe. When the read pass voltage VREAD is applied to the gate of a memory cell transistor MT, the memory cell transistor MT is turned on regardless of data stored therein.

The above-described bit number of data stored in one memory cell transistor MT and data allocation to the threshold voltage distribution lobes of memory cell transistors MT are mere examples. Various data allocations may be applied to the threshold voltage distribution lobes. The read voltages and read pass voltage may be set at the same voltage values or different values between the methods.

The memory cell array 10 may have a configuration other than the above-described one. The memory cell array 10 may have the configuration described in U.S. patent application Ser. No. 12/407,403, entitled "THREE-DIMENSIONAL STACKED NONVOLATILE SEMICONDUCTOR MEMORY", filed on Mar. 19, 2009, the configuration described in U.S. patent application Ser. No. 12/406,524, entitled "THREE-DIMENSIONAL STACKED NON-VOLATILE SEMICONDUCTOR MEMORY", filed on Mar. 18, 2009, U.S. patent application Ser. No. 12/679,991, entitled "NONVOLATILE SEMICONDUCTOR MEMORY DEVICE AND MANUFACTURING METHOD THEREOF", filed on Mar. 25, 2010, or U.S. patent application Ser. No. 14/532,030, entitled "SEMICONDUCTOR MEMORY and MANUFACTURING METHOD THEREOF", filed on Mar. 23, 2009. The entire contents of these patent applications are incorporated herein by reference.

<1-1-3-2-4> Sense Amplifier Module 12 and Data Register/Bit Counter 13

Next, a configuration of each of the sense amplifier module 12 and the data register/bit counter 13 will be described with reference to FIG. 8.

Figure 8:
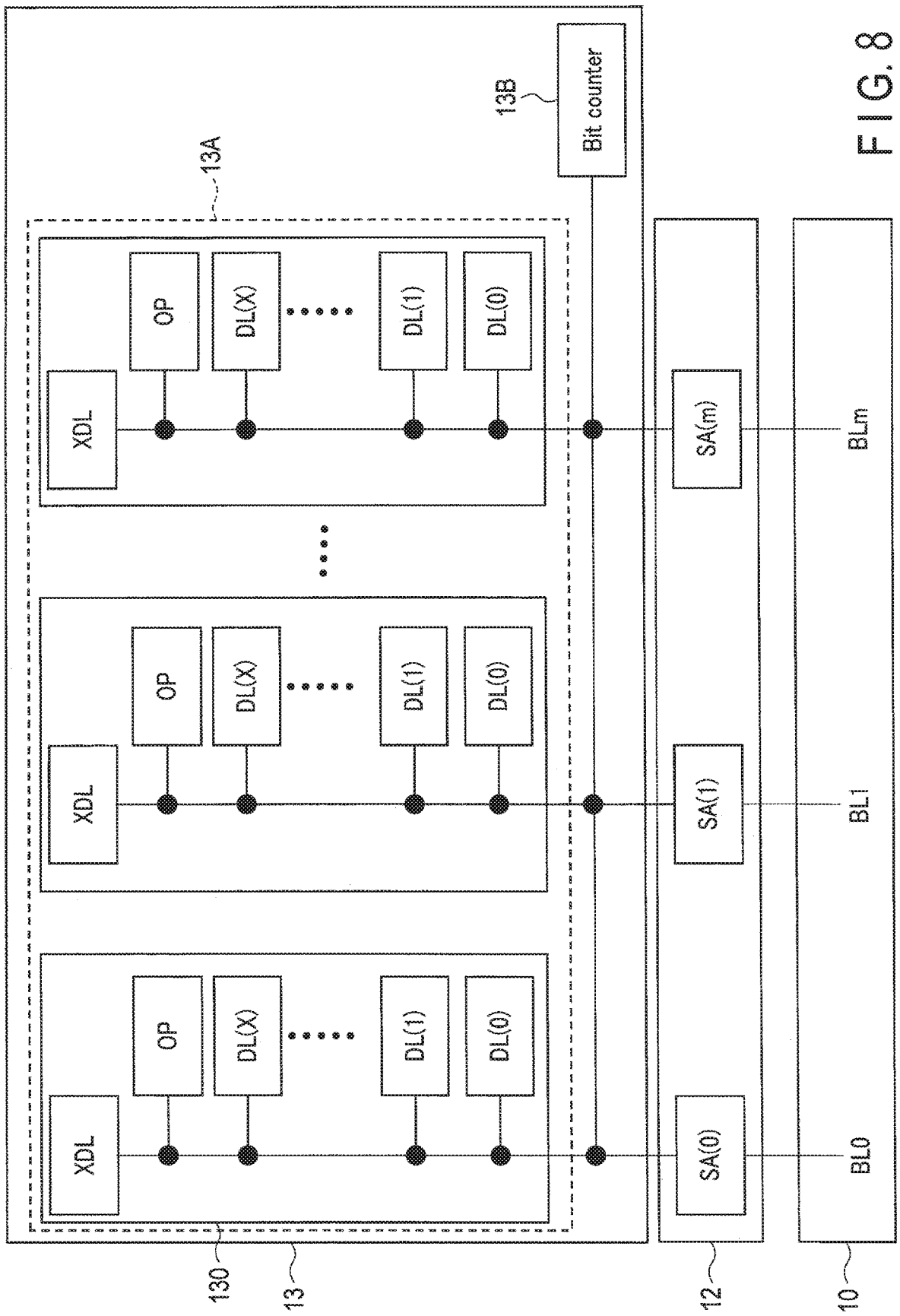
FIG. 8 is a block diagram of a sense amplifier and data register included in the semiconductor memory device according to the first embodiment.

As shown in FIG. 8, the sense amplifier module 12 includes sense amplifiers SA(0) to SA(m) provided in correspondence with the respective bit lines BL0 to BLm.

In a read operation, the sense amplifier SA senses data read out to the corresponding bit line BL, and determines whether the read data is "0" or "1". In a write operation, a voltage is applied to the bit line BL based on write data WD.

The data register/bit counter 13 includes a data register 13A and a bit counter 13B.

The data register 13A includes a latch circuit set 130 for each sense amplifier SA.

The latch circuit set 130 includes a plurality of latch circuits DL(0) to (X) (X is a given natural number), and latch circuit XDL, and an arithmetic operation circuit OP. The sense amplifier SA, latch circuits DL(0) to (X), and latch circuit XDL are connected to one another in such a manner that data are transmitted and received therebetween.

Latch circuits DL, for example, temporarily retain data. Latch circuit XDL temporarily retains read data RD received from the sense amplifier SA and write data WD received from the input/output circuit 15. Specifically, write data WD received by the input/output circuit 15 is transferred to one of latch circuits DL and sense amplifier SA via latch circuit XDL. Read data RD received from the sense amplifier SA is transferred to the input/output circuit 15 via latch circuit XDL.

The arithmetic operation circuit OP performs an arithmetic operation (such as a product operation) based on data stored in latch circuits DL(0) to (X) and latch circuit XDL.

The bit counter 13B receives a product operation result output from the latch circuit set 130, and performs a sum operation.

<1-1-3-2-5> Sense Amplifier

Figure 9:
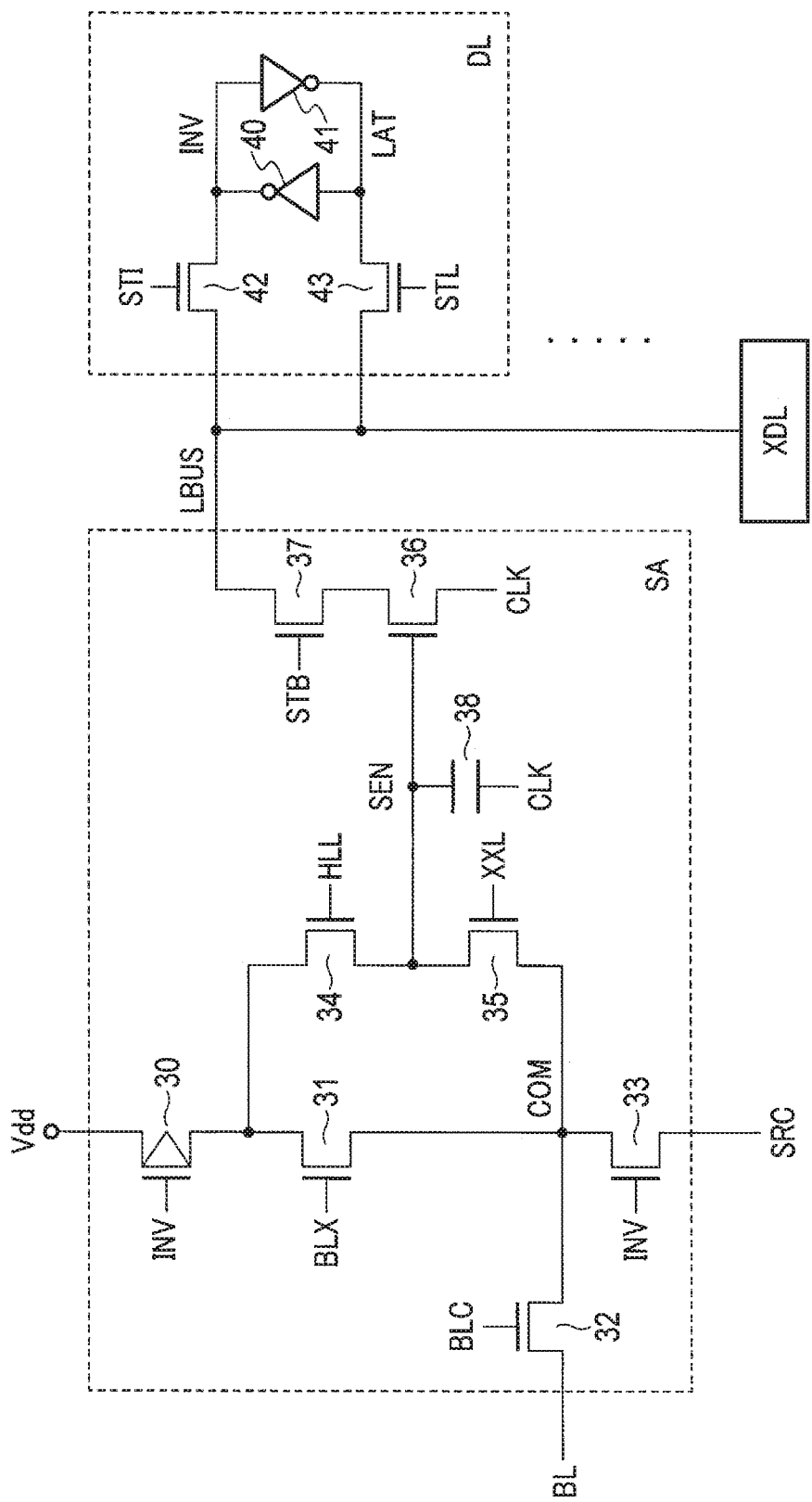
FIG. 9 is a circuit diagram showing the sense amplifier according to the first embodiment.

A detailed circuit configuration of each of the above-described sense amplifiers SA is, for example, as shown in FIG. 9. FIG. 9 shows an example of the detailed circuit configuration of one sense amplifier SA in the sense amplifier module 12.

In, for example, a read operation, the sense amplifier SA senses data read out to the corresponding bit line BL, and determines whether the read data is "0" or "1". As shown in FIG. 9, the sense amplifier SA includes a PMOS transistor 30, NMOS transistors 31 to 37, and a capacitor 38.

One end of transistor 30 is connected to a power line, and the gate of transistor 30 is coupled to node INV. One end of transistor 31 is connected to the other end of transistor 30, the other end of transistor 31 is connected to node COM, and control signal BLX is input to the gate of transistor 31. One end of transistor 32 is connected to node COM, the other end of transistor 32 is connected to the corresponding bit line BL, and control signal BLC is input to the gate of transistor 32. One end of transistor 33 is connected to node COM, the other end of transistor 33 is connected to node SRC, and the gate of transistor 33 is connected to node INV. One end of transistor 34 is connected to the other end of transistor 30, the other end of transistor 34 is connected to node SEN, and control signal HLL is input to the gate of transistor 34. One end of transistor 35 is connected to node SEN, the other end of transistor 35 is connected to node COM, and control signal XXL is input to the gate of transistor 35. Clock CLK is input to one end of transistor 36, and the gate of transistor 36 is connected to node SEN. One end of transistor 37 is connected to the other end of transistor 36, the other end of transistor 37 is connected to a bus LBUS, and control signal STB is input to the gate of transistor 37. One end of the capacitor 38 is connected to node SEN, and clock CLK is input to the other end of the capacitor 38.

FIG. 9 also shows an example of a latch circuit DL.

As shown in FIG. 9, the latch circuit DL includes inverters 40 and 41 and NMOS transistors 42 and 43.

Inverter 40 has an input terminal connected to node LAT, and an output terminal connected to node INV. Inverter 41 has an input terminal connected to node INV, and an output terminal connected to node LAT. One end of transistor 42 is connected to node INV, the other end of transistor 42 is connected to the bus LBUS, and control signal STI is input to the gate of transistor 42. One end of transistor 43 is connected to node LAT, the other end of transistor 43 is connected to the bus LBUS, and control signal STL is input to the gate of transistor 43. The circuit configurations of the other latch circuits DL are the same, and descriptions thereof are omitted.

The configuration of the data register/bit counter 13 in the embodiment is not limited to this. For example, the number of latch circuits DL included in the data register/bit counter 13 may be any number. In that case, the number of latch circuits is designed based on, for example, the bit number of data retained by one memory cell transistor MT. Described above as an example is the case where the sense amplifiers SA are in one-to-one correspondence with the bit lines BL; however, the configuration is not limited to this. For example, a plurality of bit lines BL may be connected to one sense amplifier SA via a selector.

<1-2> Operation

<1-2-1> Operation Flow

An operation flow of the memory system 400 in the identification step will be described with reference to FIG. 10. Described here is the case where identification target data is input to the memory system 400 and the NAND flash memory 100 identifies the identification target data with a neural network stored in the memory cell array 10.

[S1001]

When externally receiving identification target data, the memory controller 200 issues a product-sum operation command set including the received identification target data to the input/output circuit 15 of the NAND flash memory 100. The product-sum operation command set is a command set for causing the NAND flash memory 100 to function as the above-described hidden layer 52. A specific example of the product-sum operation command set will be described later.

[S1002]

Upon receipt of the product-sum operation command set, the input/output circuit 15 supplies a command in the product-sum operation command set to the sequencer 17. The sequencer 17 receives the command, thereby performing a product-sum operation in the NAND flash memory 100.

[S1003]

Upon receipt of the product-sum operation command set, the input/output circuit 15 supplies identification target data (input data) in the product-sum operation command set to the data register 13A.

[S1004]

The data register 13A stores the received input data in latch circuits DL.

[S1005]

The sequencer 17 causes the sense amplifiers SA to read weight coefficients (hereinafter referred to as weight data) from the memory cell array 10 based on the product-sum operation command set.

[S1006]

The sense amplifiers SA supply the weight data read from the memory cell array 10 to the data register 13A. The weight data corresponds to the weight coefficients of the neural network, and is used when performing a product-sum operation on processing data.

[S1007]

The data register 13A stores the received weight data in latch circuits DL. The latch circuits DL in which the weight data is stored differ from the latch circuits DL storing the input data.

[S1008]

In accordance with an instruction of the sequencer 17, the data register 13A performs product operations of stored input data and weight data. The data register 13A stores the results of the product operations in latch circuits DL.

[S1009]

The data register 13A supplies the results of the product operations to the bit counter 13B.

[S1010]

In accordance with an instruction of the sequencer 17, the bit counter 13B performs a sum operation based on the results of the product operations. This sum operation is performed by a digital operation or analog operation. In this way, the above-mentioned product-sum operation is performed by the data register 13A performing product operations of input data and weight data and the bit counter 13B performing a sum operation of the product operation results.

[S1011]

The bit counter 13B supplies the result of the product-sum operation to the input/output circuit 15.

[S1012]

Then, the input/output circuit 15 supplies the result of the product-sum operation to the memory controller 200.

The case where the product-sum operation is performed only once is described here for simplification; however, the embodiment is not limited to this. For example, when multi-stage processing nodes are provided in the hidden layer 52, the NAND flash memory 100 may repeat steps S1005 to S1010 in accordance with the number of stages.

<1-2-2> Command Set and Waveform Chart

The command set and waveform chart in the operation of the memory system 400 in the identification step will be described with reference to FIG. 11.

As shown in FIG. 11, when the NAND flash memory 100 is in the "ready state (R/Bn signal is at the "H" level)", the memory controller 200 issues a product-sum operation command set to the input/output circuit 15 (S1001). The product-sum operation command set includes a first command (XAH) and second command (XBH) for causing the NAND flash memory 100 to execute a product-sum operation, and an address (ADD) for designating a memory cell storing weight data, and input data (DATA) used for the product-sum operation.

Upon receipt of the first command (XAH), address (ADD), input data (DATA), and second command (XBH) in instruction, the NAND flash memory 100 starts a product-sum operation, and transitions from the "ready state (R/Bn signal is at the "H" level)" to the "busy state (R/Bn signal is at the "L" level)".

Described below are selected word line WL, control signals INV, BLC, BLX, HLL, XXL, and STB, selected bit line BL, and source line SL in step S1005.

At time T1, the sequencer 17 brings the voltage of control signal INV to the "L" level, raises the voltage of control signal BLC from Vss to Vblc, and raises the voltage of control signal BLX from Vss to Vblc. Accordingly, transistors 30, 31, and 32 of the relevant sense amplifier SA are turned on, and the voltage of the bit line BL is raised from Vss to VBL (see FIG. 9). The sequencer 17 also raises the voltage of the source line SL from Vss to VSL.

At time T2, the sequencer 17 raises the voltage of the selected word line WL from Vss to AR. Accordingly, when the selected memory cell connected to the selected word line WL is turned on, the voltage of the bit line BL is lowered, whereas when the selected memory cell is not turned on, the voltage of the bit line BL is maintained. The sequencer 17 also raises the voltage of control signal HLL from the "L" level to the "H" level. Accordingly, transistor 34 is turned on, and node SEN of the sense amplifier SA is charged (see FIG. 9).

At time T3, the sequencer 17 lowers the voltage of control signal HLL from the "H" level to the "L" level, and raises the voltage of control signal XXL from the "L" level to the "H" level. Accordingly, transistor 35 is turned on, and the bit line BL is electrically connected to node SEN via transistors 35 and 32. Therefore, the voltage of node SEN becomes a voltage based on the voltage of the bit line BL (see FIG. 9).

At time T4, the sequencer 17 raises the voltage of control signal STB from the "L" level to the "H" level while maintaining the voltage of control signal XXL at the "H" level. Accordingly, transistor 37 is turned on, and information based on the voltage of the gate electrode of transistor 36 is transferred to the bus LBUS (see FIG. 9). The voltage of the bus LBUS is stored in a latch circuit DL as a result relating to voltage AR.

Specifically, when the selected memory cell is turned on, the voltage of the bit line BL is low, and the voltage of node SEN is consequently low. Therefore, transistor 36 is turned off, and the voltage of the bus LBUS is maintained. In contrast, when the selected memory cell is turned off, the voltage of the bit line BL is maintained, and the voltage of node SEN is consequently maintained. Therefore, transistor 36 is turned on, and the bus LBUS is connected to CLK, and the voltage is lowered.

The operation from time T2 to time T5 as described above is an operation to read the "A" state ("A"-state read).

Next, from time T5 to time T6, the sequencer 17 raises the voltage of the selected word line WL from AR to BR, and performs the same operation as the above-described operation from time T2 to time T5, thereby performing an operation to read the "B" state ("B"-state read).

Next, from time T6 to time T7, the sequencer 17 raises the voltage of the selected word line WL from BR to CR, and performs the same operation as the above-described operation from time T2 to time T5, thereby performing an operation to read the "C" state ("C"-state read).

By performing the operations from time T1 to time T7 as described above, weight data are read out to latch circuits DL.

The sequencer 17 then performs product operations using the latch circuit sets 130, and performs a sum operation using the bit counter 13B. As a result, the sequencer 17 outputs the operation result of the bit counter 13B to the memory controller 200 as a product-sum operation result (DATA) (S1012).

This transmissions/receptions of signals DQ will be collectively referred to as a command sequence.

<1-2-3> Comparative Example

Figure 12:
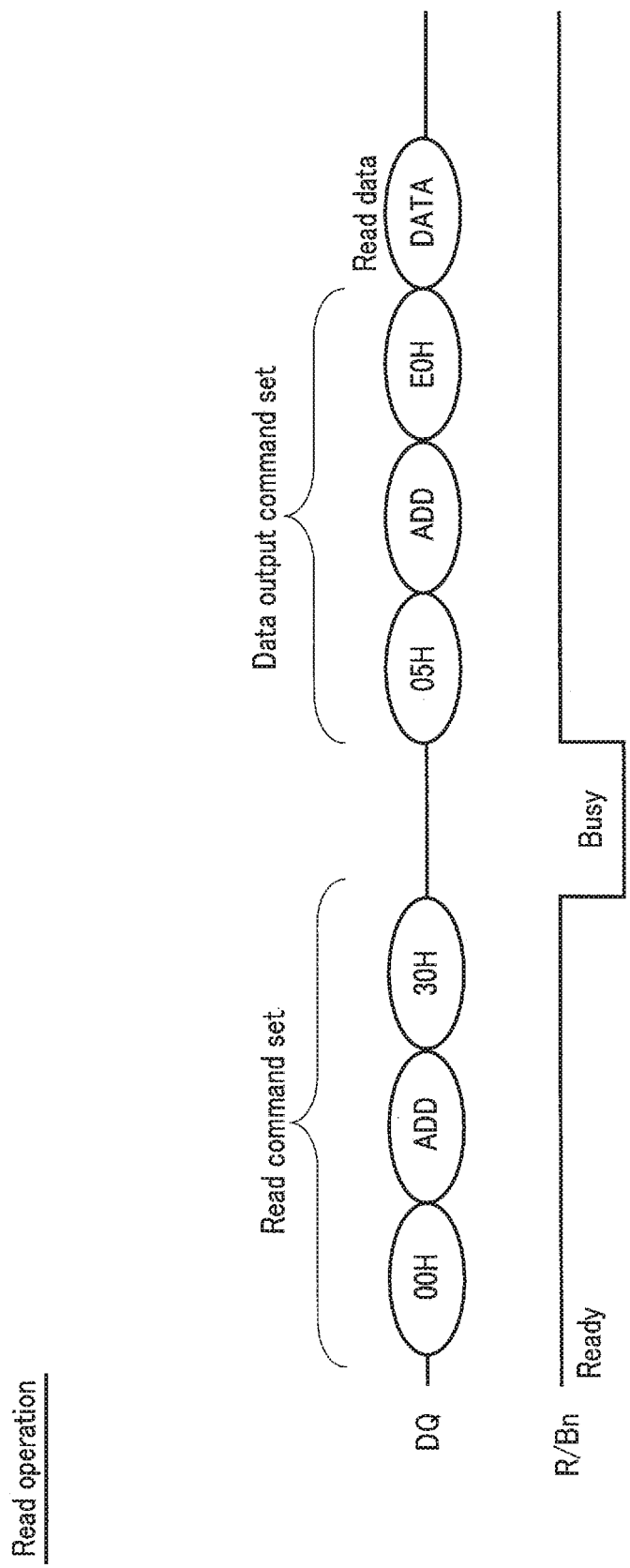
FIG. 12 shows a command sequence relating to a read operation.
Figure 14:
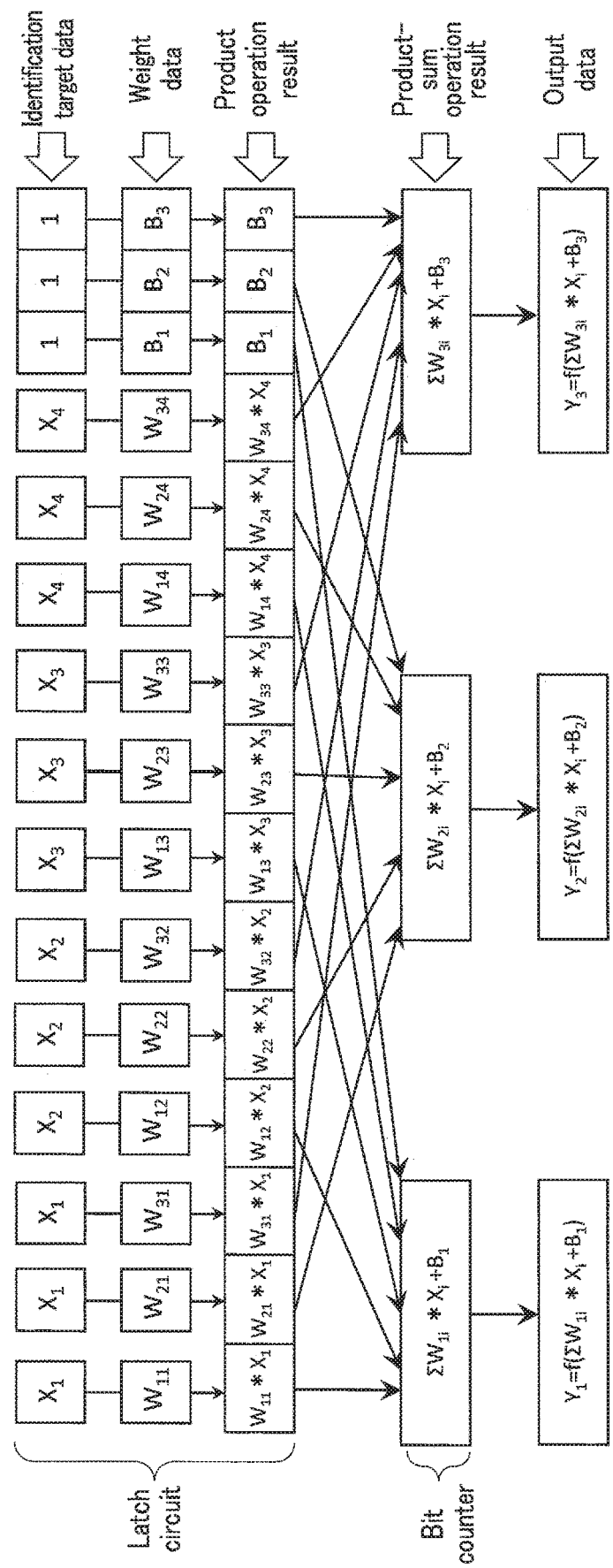
FIG. 14 is a diagram showing specific data stored in latch circuits and bit counter.

The difference between the command sequence in the present embodiment and those of a read operation and write operation will be described. The read operation will be described with reference to FIG. 12. As shown in FIG. 12, in the read operation, the memory controller 200 first issues a read command set to the NAND flash memory 100, whereby data is read from the memory cell array 10 of the NAND flash memory 100 out to the data register/bit counter 13. The memory controller 200 then issues a data output command set to the NAND flash memory 100, thereby receiving the data read out to the data register/bit counter 13.

Next, the write operation will be described with reference to FIG. 13. As shown in FIG. 13, in the write operation, the memory controller 200 issues a write command set (including write data) to the NAND flash memory 100, whereby write data are written in the memory cell array 10 of the NAND flash memory 100.

As described above, in the read operation, data is output as signal DQ by the memory controller 200 issuing a data output command set after issuing a read command set (after transitioning to the busy state). In the write operation, write data are written in the memory cell array 10 by the memory controller 200 issuing a write command set including write data.

<1-3> Advantageous Effects

In the present embodiment, the memory controller 200 issues a product-sum operation command set including identification target data and an address of weight data, thereby receiving a product-sum operation result based on the identification target data and weight data from the NAND flash memory 100.

In recent years, the size of one page of the NAND flash memory has increased as many as several kilobytes. Therefore, the NAND flash memory includes a large-capacity data register, thereby exhibiting excellent Sequential Write/Read performance. However, there has been no specific report of application of such a technical advantage to AI technology. For example, if memory technology is applied to arithmetic operation methods or algorithms characteristic of AI, a novel technical area may be developed, which may contribute to human life and society.

The present embodiment enables a product-sum operation simply by causing the memory controller 200 to issue a product-sum operation command set to a NAND flash memory with a large one-page size; therefore, a high-speed AI function is easily realized. Accordingly, mere use of the NAND flash memory makes it possible to easily obtain a high-quality AI function.

<1-4> Specific Example

A specific example of the first embodiment when identification target data is input to the NAND flash memory will be described. In particular, the flow of identification target data, weight data, and operation results will be described.

As shown in FIG. 3, when attention is focused on one identification target data item (such as $X_1$), one data item is used for arithmetic operations corresponding to the number of nodes arranged in parallel in the hidden layer 52. For example, in the case of FIG. 3, data item $X_1$ is used for data items $Y_1$, $Y_2$, and $Y_3$. Namely, data item $X_1$ is subjected to a product operation with each of weights $W_{11}$, $W_{21}$, and $W_{31}$. The above-described NAND flash memory performs one product operation with one latch circuit set 130. In the case of FIG. 3, three product operations are performed in relation to data $X_1$; therefore, three latch circuit sets 130 are used. Specifically, as shown in FIG. 4, the identification target data items ($X_1$ to $X_4$) are assigned to each of the three latch circuit sets 130. As described above, the number of required identification target data items changes depending on the number of product operations performed on one identification target data item. In this case, the number of required data items $X_1$ to $X_4$ is three each. Namely, the identification target data items input to the data register 13A need to be $X_1$, $X_1$, $X_1$, $X_2$, $X_2$, $X_2$, $X_3$, $X_3$, $X_3$, $X_4$, $X_4$, and $X_4$. Those identification target data items may be generated by the memory controller 200, by the sequencer 17, or by another component. Weight data for performing a product operation with each identification target data item is read out from the memory cell array 10 to latch circuits. Then, the latch circuit set 130 performs a product operation of the read weight data and the identification target data item, and the product operation result is stored in a latch circuit. Biases (constant terms) $B_1$ to $B_3$ added to the product-sum operation results are also stored in latch circuits as weight data.

The bit counter 13B then reads out a product operation result from each latch circuit set 130, performs a sum operation, and outputs a product-sum operation result. The bit counter 13B generates data Y of the hidden layer and generates output data.

Figure 15:
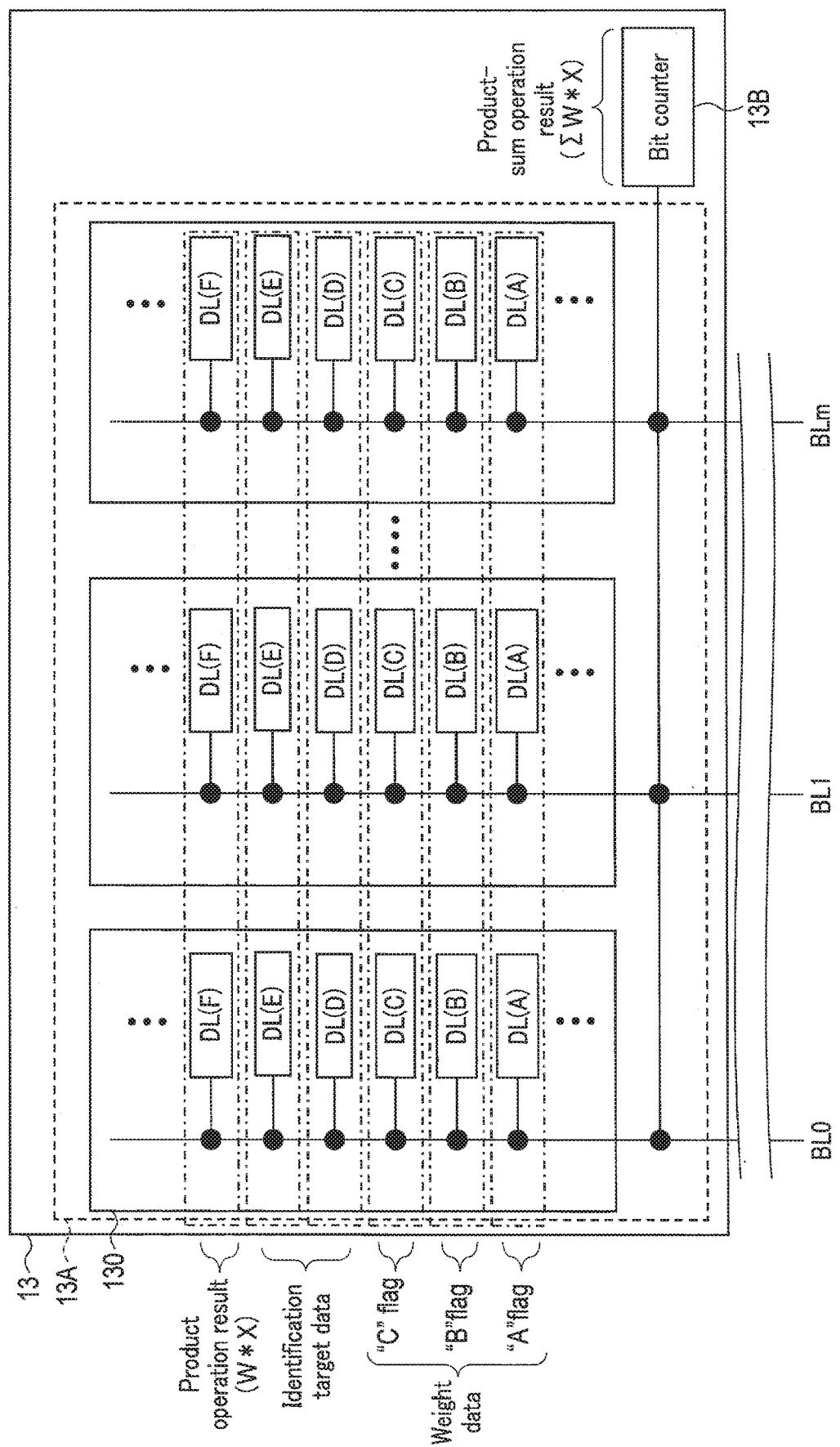
FIG. 15 is a diagram showing types of data stored in latch circuits.

A specific method for using the latch circuit set 130 will be described with reference to FIG. 15. FIG. 15 illustrates a case where each of weight data and identification target data is four-valued (multi-valued).

As shown in FIG. 15, an AR read result, a BR read result, and a CR read result are required to enable the latch circuit set 130 to determine four-valued data. In FIG. 15, for example, an AR read result ("A" flag) is stored in latch circuit DL(A), a BR read result ("B" flag) is stored in latch circuit DL(B), and a CR read result ("C" flag) is stored in latch circuit DL(C). The latch circuit set 130 determines weight data based on data stored in DL(A), DL(B), and DL(C). When weight data is not four-valued, as-needed latch circuits DL may be used.

Four-valued identification target data is stored in, for example, two latch circuits DL(D) and DL(E). When identification target data is not four-valued, as-needed latch circuits DL may be used.

The product operation result is stored in, for example, latch circuit DL(F). However, another latch circuit DL may be used for the product operation result.

The sum operation is performed by the bit counter 13B, and the product-sum operation result is stored in a storage area which is not shown.

<2> Second Embodiment

Next, the second embodiment will be described. In the first embodiment, data is determined via a bit line. In the second embodiment, the case where data is determined via the source line will be described. Hereinafter, descriptions of portions similar to those of the first embodiment will be omitted.

<2-1> Specific Configuration of Identification Device

<2-1-1> NAND Flash Memory

Here, as a specific hardware configuration for realizing the identification device 5, the memory system 400 will be described as an example.

As shown in FIG. 16, the NAND flash memory 100 included in the memory system 400 further includes a source line control circuit 23. The source line control circuit 23 controls the voltage of the source line SL.

<2-1-2> Voltage Generator and Source Line Control Circuit

The voltage generator 22 and source line control circuit 23 will be described with reference to FIG. 17.

Figure 17:
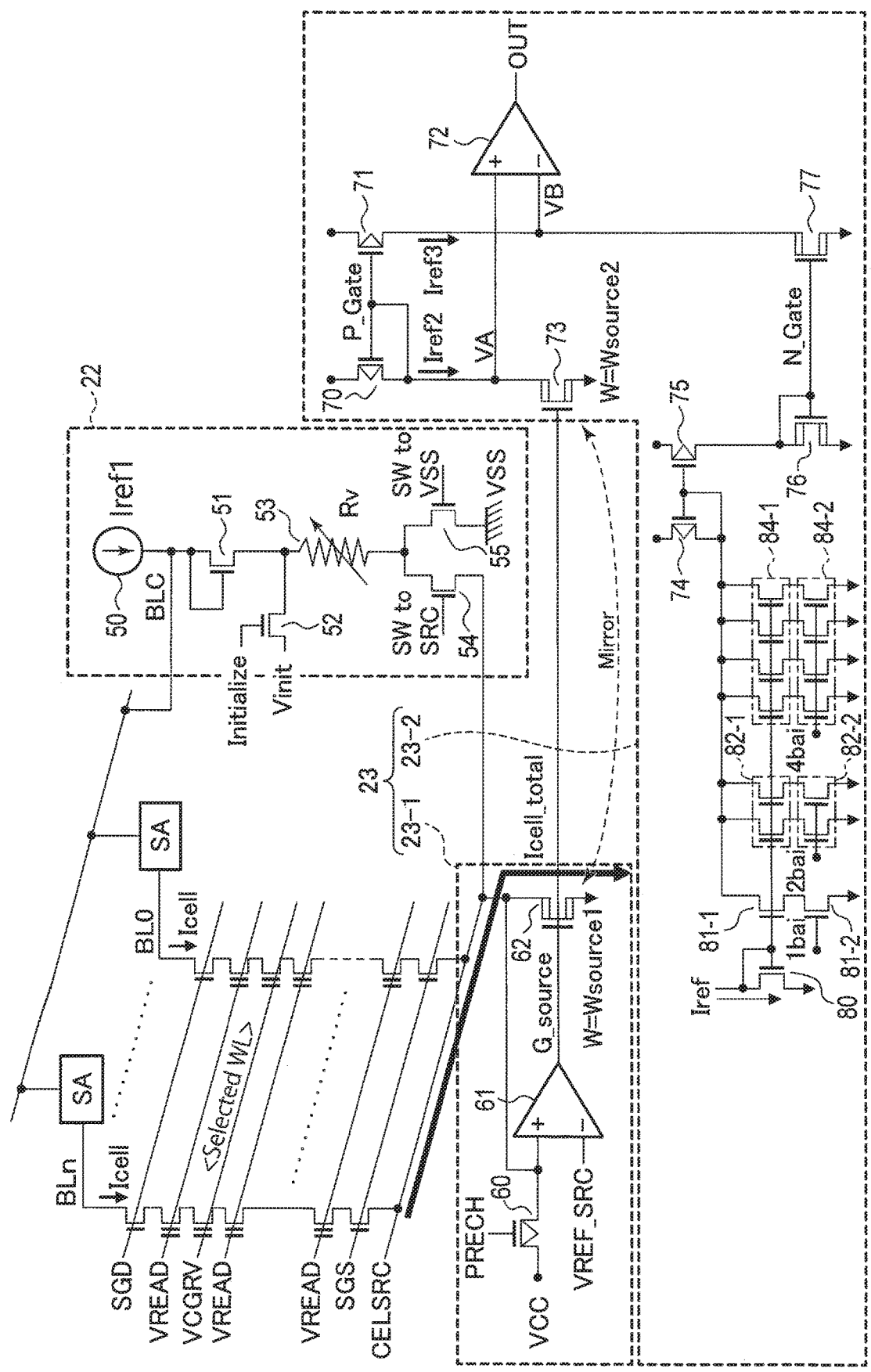
FIG. 17 is a circuit diagram showing an example of a source line control circuit according to the second embodiment.

FIG. 17 shows part of the voltage generator 22. The voltage generator 22 includes a constant current source 50, NMOS transistors 51, 52, 54, and 55, and a resistance element 53. In FIG. 17, the voltage generator 22 includes a circuit for generating signal BLC of the sense amplifiers SA and a circuit for charging the source line.

Specifically, the constant current source 50 generates current Iref1 and supplies it as signal BLC. NMOS transistor 51 has one end and a gate electrode which are connected to the output end of the constant current source 50.

NMOS transistor 52 has one end to which signal Vint is input, a gate electrode to which signal Initialize is input, and the other end connected to the other end of NMOS transistor 51.

One end of the resistance element 53 is connected to the other ends of NMOS transistors 51 and 52.

NMOS transistor 54 has one end connected to the other end of the resistance element 53, a gate electrode to which signal SW to SRC is input, and the other end connected to the source line SL.

NMOS transistor 55 has one end connected to the other end of the resistance element 53, a gate electrode to which signal SW to VSS is input, and the other end connected to the reference voltage VSS.

The source line control circuit 23 includes a voltage comparator 23-1 and a detection circuit 23-2. The source line control circuit 23 monitors the total cell current (Icell_total), and convert it into a digital value. Namely, the circuit of FIG. 17 is an example of the circuit for determining the cell-source current value (value of the current flowing through the source line) with an analog circuit. In FIG. 17, the current value Icell_total corresponding to the product-sum operation result is mirrored by a current mirror circuit, and is compared with a current value (reference value) provided by a regulator.

The voltage comparator 23-1 compares the voltage of the source line SL with reference voltage VREF_SRC, and provides the source line SL with a voltage. As shown in FIG. 17, the voltage comparator 23-1 includes a PMOS transistor 60, a comparator 61, and an NMOS transistor 62.

PMOS transistor 60 has a gate to which a precharge signal PRECH is input, one end externally supplied with voltage VCC, and the other end connected to the source line SL. Signal PRECH is brought to the "L" level when the bit line is precharged in a data read operation, thereby turning on PMOS transistor 60. As a result, the voltage of the source line SL rises.

The comparator 61 has a non-inversion input terminal (+) connected to the source line SL and an inversion input terminal (−) to which voltage VREF_SRC is input. Namely, the comparator 61 compares the voltage of the source line SL with voltage VREF_SRC, and outputs an "H"-level signal when the voltage of the source line SL exceeds voltage VREF_SRC. Voltage VREF_SRC takes a value equal to or larger than the absolute value of the read level V01 for "0" data, of which threshold voltage is the lowest.

NMOS transistor 62 has a drain connected to the source line SL, a grounded source, and a gate provided with the comparison result of the comparator 61. Hereinafter, the gate of NMOS transistor 62, i.e., the output node of the comparator 61 will be referred to as node G_Source. The gate width W of NMOS transistor 62 will be referred to as gate width Wsource1.

The detection circuit 23-2 includes PMOS transistors 70, 71, 74, and 75, a comparator 72, and NMOS transistors 73, 76, 77, 80, 81-1, 81-2, 82-1, 82-2, 84-1, and 84-2.

PMOS transistor 70 has a source connected to the power-supply voltage VDD, and a gate and drain connected to each other. The node to which the gate and drain of PMOS transistor 70 are connected will be referred to as node P_GATE. For example, the current supplied by PMOS transistor 70 is expressed as Iref2.

PMOS transistor 71 has a source connected to the power-supply voltage VDD, and a gate connected to node P_GATE. For example, the current supplied by PMOS transistor 71 is expressed as Iref3.

PMOS transistors 70 and 71 form a current mirror. Therefore, current Iref2 is proportional to current Iref3.

The comparator 72 has a non-inversion input terminal (+) connected to the drain of PMOS transistor 70, and an inversion input terminal (−) connected to the drain of PMOS transistor 71. Namely, the comparator 72 compares the voltage VA of the drain of PMOS transistor 70 with the voltage VB of the drain of PMOS transistor 71, and outputs an "H"-level signal when voltage VA exceeds voltage VB.

NMOS transistor 73 has a drain connected to node P_GATE, a grounded source, and a gate provided with the comparison result of comparator 61. The gate width W of NMOS transistor 73 will be referred to as gate width Wsource2.

PMOS transistor 74 has a source connected to the power-supply voltage VDD, and a gate and drain connected to each other.

PMOS transistor 75 has a source connected to the power-supply voltage VDD, a gate connected to the gate and drain of PMOS transistor 74, and a drain connected to node N_GATE.

PMOS transistors 74 and 75 form a current mirror.

NMOS transistor 76 has a drain and gate connected to node N_GATE, and a grounded source.

NMOS transistor 77 has a drain connected to the drain of PMOS transistor 71, a gate connected to node N_GATE, and a grounded source.

NMOS transistors 76 and 77 form a current mirror.

NMOS transistor 80 has a drain and gate supplied with the reference current Iref, and a grounded source.

NMOS transistor 81-1 has a drain connected to the gate and drain of PMOS transistor 74, and a gate supplied with the reference current Iref.

NMOS transistor 81-2 has a drain connected to the source of NMOS transistor 81-1, a gate supplied with signal 1bai, and a grounded source.

NMOS transistor 82-1 includes two parallel NMOS transistors (transistors having the same characteristics as NMOS transistor 81-1), each having a drain connected to the gate and drain of PMOS transistor 74, and a gate supplied with the reference current Iref.

NMOS transistor 82-2 includes two parallel NMOS transistors (transistors having the same characteristics as NMOS transistor 81-2), each having a drain connected to the source of NMOS transistor 82-1, a gate supplied with signal 2bai, and a grounded source.

NMOS transistor 84-1 includes four parallel NMOS transistors (transistors having the same characteristics as NMOS transistor 81-1), each having a drain connected to the gate and drain of PMOS transistor 74, and a gate supplied with the reference current Iref.

NMOS transistor 84-2 includes four parallel NMOS transistors (transistors having the same characteristics as NMOS transistor 81-2), each having a drain connected to the source of NMOS transistor 82-1, a gate supplied with signal 4bai, and a grounded source.

The sequencer 17 brings signals 1bai, 2bai, and 4bai to the "H" level as appropriate, thereby controlling the values of the currents flowing through PMOS transistors 74 and 75. Therefore, the sequencer 17 controls the values of the currents flowing through NMOS transistors 76 and 77; as a result, voltage VB is controlled at will.

<2-2> Operation

As described above, the source line control circuit 23 causes the current mirror circuit to mirror the current value Icell_total corresponding to the product-sum operation result, and compares the current value Icell_total with the current value (reference value) provided by the regulator. To improve the accuracy of arithmetic operations, it is necessary to reduce the variations of the cell current Icell.

Figure 18:
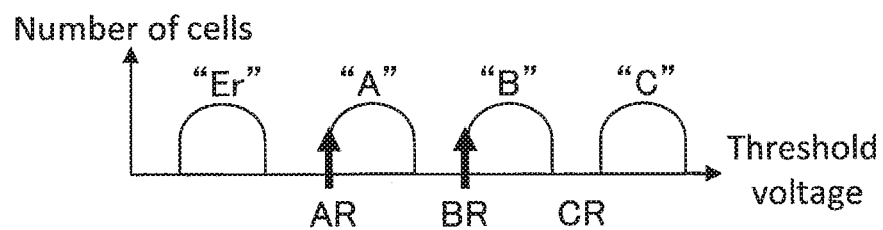
FIG. 18 is a diagram showing an example of a normal read operation.
Figure 19:
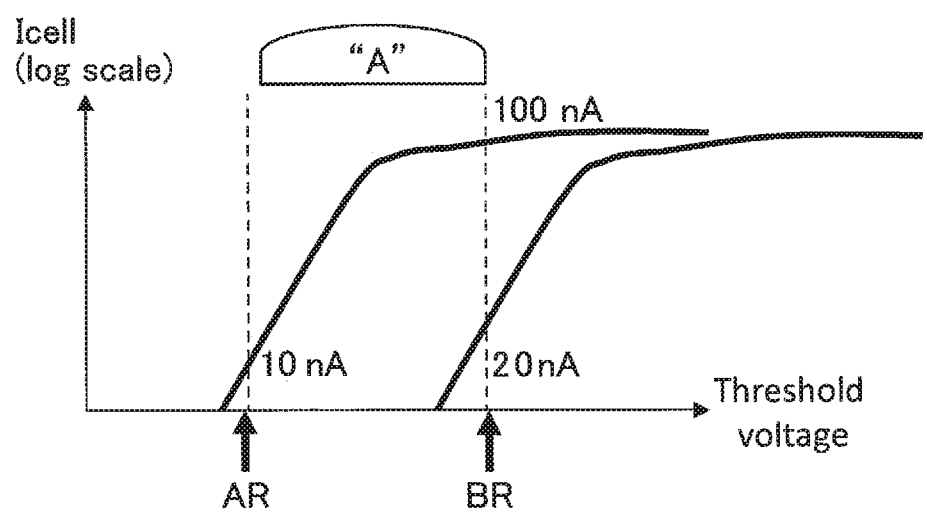
FIG. 19 is a diagram for explaining variations of cell current.

As shown in, for example, FIGS. 18 and 19, even if a read operation is performed by using read voltage AR and read voltage BR, it is not uncommon that, for example, the current Icell when voltage BR is applied varies from 20 nA to 100 nA.

Under the circumstances, in the second embodiment, magnitude relationship determination is performed with the read voltage changed in stages, and thereby the absolute value of the cell-source current is finally detected. This will be described with reference to FIG. 20.

Figure 20:
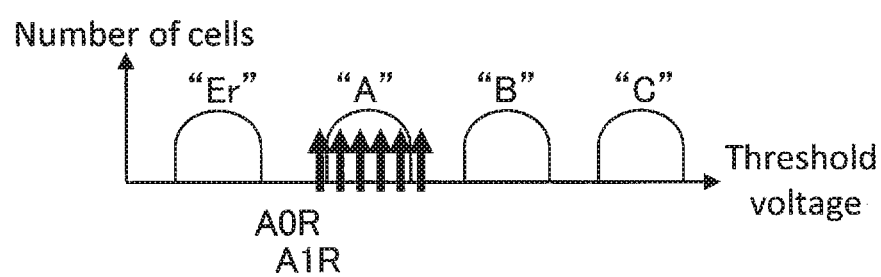
FIG. 20 is a diagram for explaining an example of a write operation in the second embodiment.
Figure 21:
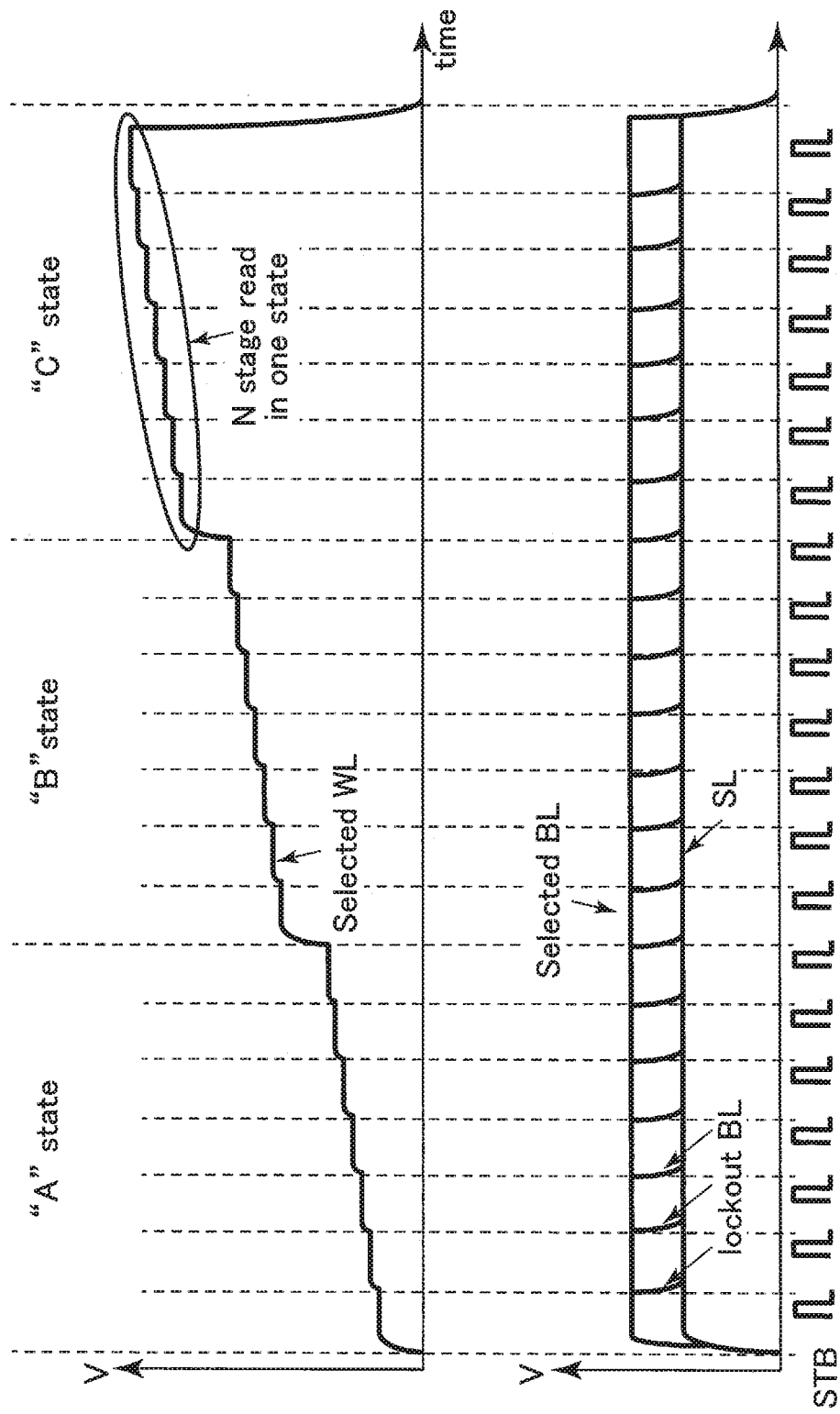
FIG. 21 is a diagram showing an operation image of a word line WL and bit line BL in the second embodiment.

FIGS. 20 and 21 are diagrams for explaining an example of the read operation in the second embodiment. In the second embodiment, for example, read voltage AR applied to the selected word line (Selected WL) is divided into, for example, N stages for one state, such as A0R, A1R, .... As shown in FIG. 21, a read is performed by first using read voltage A0R, the current flowing through the source line SL is monitored, and the bit line BL that allows a current to flow therethrogh is locked out. Then, a read is performed by using read voltage A1R, the current flowing through the source line is monitored, and the bit line BL that allows a current to flow therethrogh is locked out. By using the other-stage read voltages, the same operation is repeated. The sequencer 17 stores a read result in a latch circuit by raising signal STB whenever a read voltage is applied.

Figure 22:
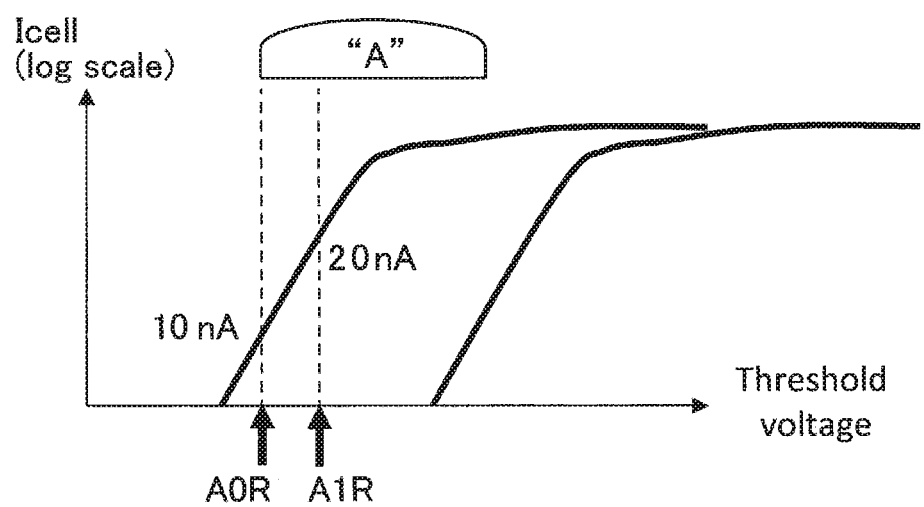
FIG. 22 is a diagram for explaining that an influence of variations of cell current is eliminated.

As shown in FIG. 22, in every read operation in the above-described process, Icell determined as "1" is even up at approximately 20 nA [nanoampere]. Therefore, the accuracy of the product-sum operation is improved.

<2-3> Advantageous Effects

In the second embodiment, the product-sum operation result is detected from the current flowing through the source line in a read operation, as described above. Namely, the selected bit line BL is precharged based on input data, and the bit line BL turned on by AR is locked out. By subsequently applying read voltages AR, BR, and CR, the current flowing through the source line is monitored at each time, and the product-sum operation results are obtained from the current values.

At that time, by incrementing the read voltage in stages for each state, the adverse influence of the variations of the cell current on the accuracy is decreased to such an extent that the influence is ignorable. This enables the product-sum operation result to be detected with sufficient accuracy from the current flowing through the source line in a read operation.

In particular, the sum operations are executed in the memory cell array at once in the second embodiment, which contributes to reduction in the chip size.

In existing semiconductor memory devices, all bit lines are selected in a read operation. Namely, there has been no idea of selecting a bit line in accordance with the logic level of input data. Therefore, it has been impossible to get an idea of implementing a product-sum operation.

In the second embodiment, however, the product-sum operation result is realized by selecting a bit line in accordance with the logic level of input data, raising the threshold voltage in stages, locking out the turned-on bit line, and detecting the currents flowing through the source line in the process of repeating the forgoing steps.

Accordingly, the second embodiment can also provide a semiconductor memory device with an arithmetic operation function.

<3> Others

The present invention is not limited to the above-described first and second embodiments. For example, in the first embodiment, the results of the product operations can be obtained before the result of the product-sum operation is obtained; therefore, the results of the product operations may be taken out to the outside of the NAND flash memory 100. Furthermore, information that can be taken out to the outside of the NAND flash memory 100 may be the result of the product-sum operation, or may be an inference obtained by substituting the result of the product-sum operation into an activation function.

In FIG. 10, the NAND flash memory 100 supplies a product-sum operation result to the memory controller 200 (step S1012). However, the NAND flash memory 100 may supply an inference (identification score) to the memory controller 200. The "inference" indicates a degree of matching between the input data set (input data) and the label associated with the input data. For example, when the input data is a picture, the NAND flash memory 100 infers what is in the picture (human, car, tree, etc.) of the input data. The result of the inference is referred to as an inference (identification score).

Figure 23:
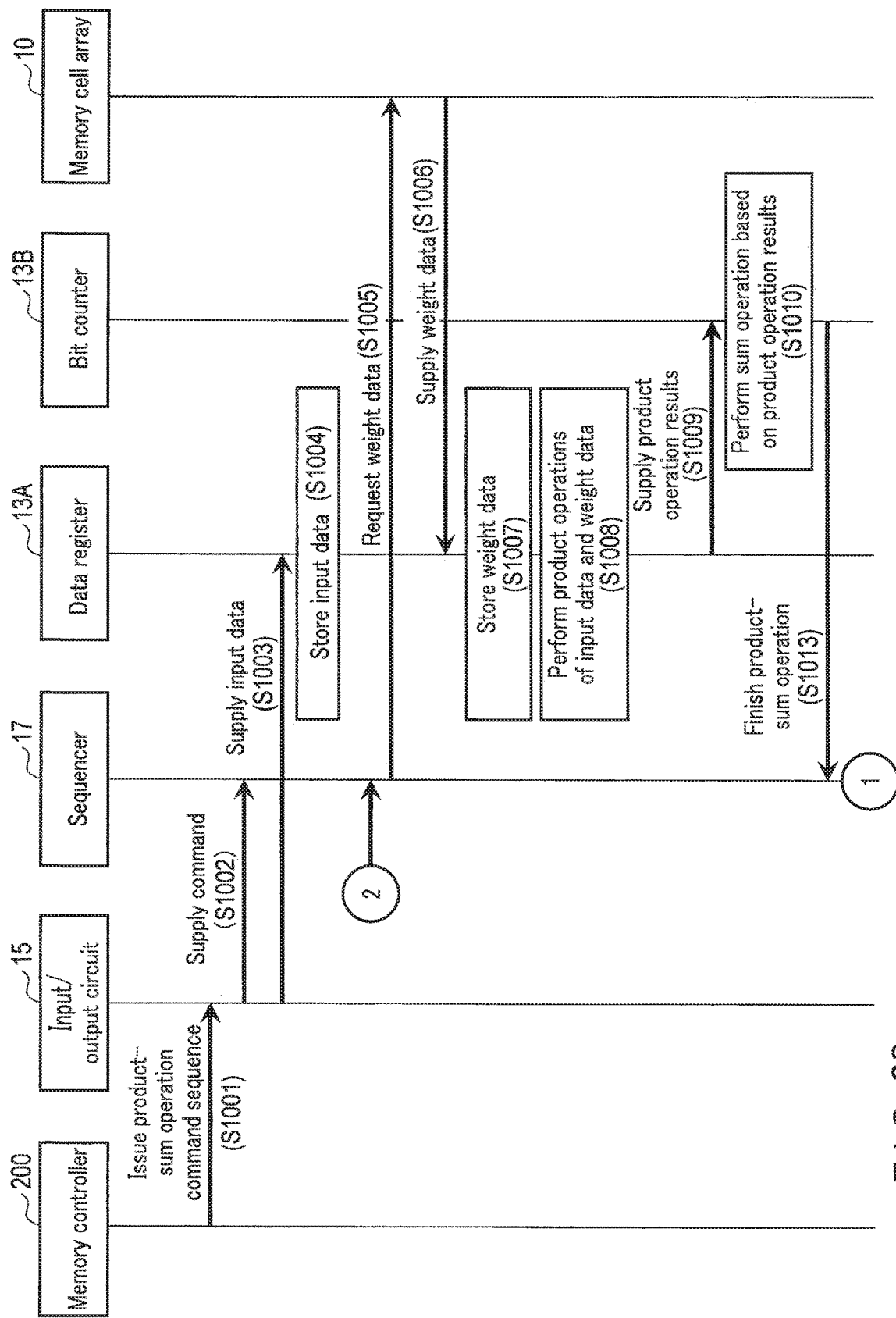
FIG. 23 is a flowchart showing an operation of a memory system according to a modification of FIG. 10.
Figure 24:
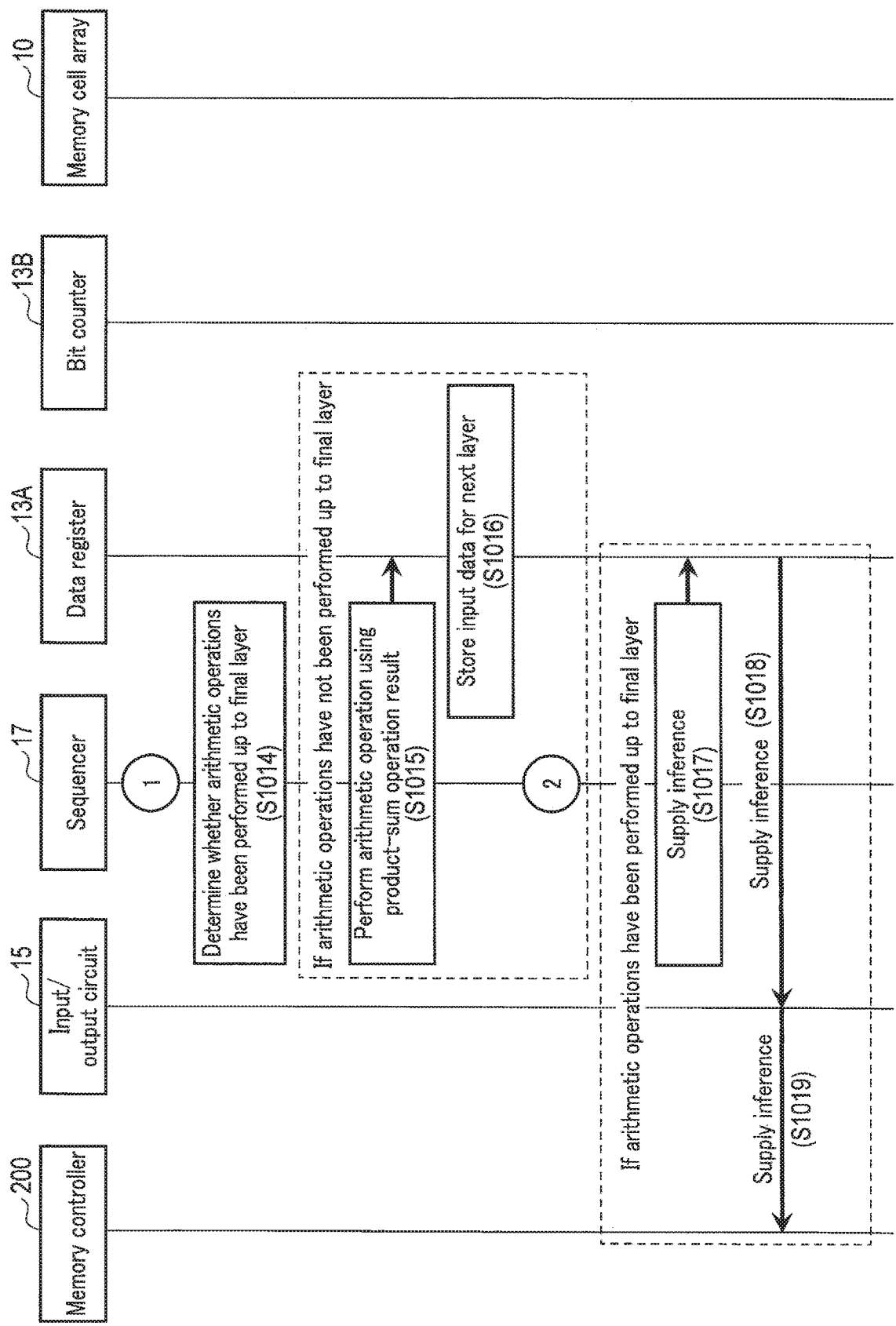
FIG. 24 is a flowchart showing an operation after that shown in FIG. 23.

Here, a modification of FIG. 10 will be described with reference to FIGS. 23 and 24.

[S1001]-[S1010]

The operations are the same as those described with reference to FIG. 10, and descriptions thereof are omitted.

[S1013]

Upon completion of the product-sum operation, the bit counter 13B notifies the completion to the sequencer 17.

[S1014]

The operations after step S1013 will be described with reference to FIG. 24.

Upon receipt of the notice of completion of the product-sum operation, the sequencer 17 determines whether the arithmetic operations have been performed up to the final layer. Specifically, the sequencer 17 determines whether or not the processing at the final processing node of a plurality of nodes included in the hidden layer 52 has been completed.

[S1015]

When determining that the processing at the final processing node has not been completed, the sequencer 17 performs a product-sum operation using the latest product-sum operation result as input data.

Specifically, the sequencer 17 performs a calculation by inputting the latest product-sum operation result stored in the data register 13A into the activation function, and causes the data register 13A to store the operation result of the activation function as input data for the next layer. When the relevant layer is the final layer, an inference is obtained by this step.

[S1016]

The data register 13A stores the operation result of the activation function as input data for the next layer. Then, the NAND flash memory 100 repeats step S1005.

When determining that the processing at the final processing node has not been completed, the sequencer 17 repeats steps S1015, S1016, S1005 to S1010, S1013, and S1014.

[S1017]

When determining that the processing at the final processing node has been completed, the sequencer 17 causes the NAND flash memory 100 to output the operation result stored in the data register 13A as an inference.

[S1017]

The data register 13A supplies the inference to the input/output circuit 15 in accordance with an instruction of the sequencer 17.

[S1018]

Then, the input/output circuit 15 supplies the inference to the memory controller 200. The NAND flash memory 100 may supply the inference (identification score) to the memory controller 200 in this manner.

While some embodiments have been described, the embodiments have been presented as examples, and are not intended to limit the scope of the invention. These novel embodiments can be implemented in various other forms, and various omissions, replacements, and changes can be made without departing from the spirit of the invention. These embodiments and modifications thereof are included in the scope and spirit of the invention, and are included in the scope of the claimed inventions and their equivalents.

The invention claimed is:

1. A memory system comprising:
a memory controller configured to send a first command set including arithmetic operation target data and an address that designates a memory cell to store weight data; and
a nonvolatile semiconductor memory connected to the memory controller,
wherein the nonvolatile semiconductor memory includes:
an input/output circuit configured to receive the command set from the memory controller;
the memory cell configured to store the weight data;
a sense amplifier configured to read the weight data from the memory cell based on the address when the command set is received;
a voltage generator configured to apply voltages to the memory cell and the sense amplifier based on the command set;
a first latch circuit configured to store the arithmetic operation target data; and
a second latch circuit configured to store the weight data read from memory cell, and
wherein the input/output circuit sends, to the memory controller, arithmetic operation result data using the first latch circuit and the second latch circuit.

2. The memory system according to claim 1, wherein the nonvolatile semiconductor memory further includes a column decoder configured to select the second latch circuit based on the address.

3. The memory system according to claim 1, wherein the nonvolatile semiconductor memory further includes a memory cell array including a plurality of memory cells, and is configured to identify the arithmetic operation target data by way of a neural network stored in the memory cell array when the arithmetic operation target data is input.

4. The memory system according to claim 1, wherein the arithmetic operation result data indicates a degree of matching between the arithmetic operation target data and a label associated with the arithmetic operation target data.

5. The memory system according to claim 1, wherein the nonvolatile semiconductor memory is a NAND flash memory.

6. The memory system according to claim 1, wherein the memory controller includes a first interface circuit configured to receive the arithmetic operation target data from an external apparatus and a second interface circuit configured to transmit the command set to the nonvolatile semiconductor memory.

7. A nonvolatile semiconductor memory comprising:
an input/output circuit configured to receive, from a memory controller, a command set including arithmetic operation target data and an address that designates a memory cell to store weight data;
the memory cell configured to store the weight data;
a sense amplifier configured to read the weight data from the memory cell based on the address when the command set is received;
a voltage generator configured to apply voltages to the memory cell and the sense amplifier based on the command set; and
a first latch circuit configured to store the arithmetic operation target data; and
a second latch circuit configured to store the weight data read from the memory cell,
wherein the input/output circuit sends, to the memory controller, arithmetic operation result data using the first latch circuit and the second latch circuit.

8. The nonvolatile semiconductor memory according to claim 7, further comprising:
a column decoder configured to select the second latch circuit based on the address.

9. The nonvolatile semiconductor memory according to claim 7, further comprising:
a memory cell array including a plurality of memory cells, wherein the arithmetic operation target data is identified by way of a neural network stored in the memory cell array when the arithmetic operation target data is input.

10. The nonvolatile semiconductor memory according to claim 7, wherein the arithmetic operation result data indicates a degree of matching between the arithmetic operation target data and a label associated with the arithmetic operation target data.

11. The nonvolatile semiconductor memory according to claim 7, wherein the nonvolatile semiconductor memory is a NAND flash memory.

12. A memory controller configured to:
send, to a nonvolatile semiconductor memory, a first command set including arithmetic operation target data and an address that designates a memory cell to store weight data;
cause the nonvolatile semiconductor memory to perform an arithmetic operation using the arithmetic operation target data and the weight data; and
receive arithmetic operation result data from the nonvolatile semiconductor memory.

13. The memory controller according to claim 12, comprising:
a first interface circuit configured to receive arithmetic operation target data from an external apparatus; and
a second interface circuit configured to send the arithmetic operation target data to the nonvolatile semiconductor memory.

* * * * *